United States Patent
Despain

(10) Patent No.: US 7,181,085 B1
(45) Date of Patent: Feb. 20, 2007

(54) ADAPTIVE MULTISTAGE WIENER FILTER

(75) Inventor: Alvin M. Despain, Los Angeles, CA (US)

(73) Assignee: Acorn Technologies, Inc., Pacific Palisades, CA (US)

( * ) Notice: Subject to any disclaimer, the term of this patent is extended or adjusted under 35 U.S.C. 154(b) by 829 days.

(21) Appl. No.: 10/348,670

(22) Filed: Jan. 21, 2003

Related U.S. Application Data

(60) Provisional application No. 60/370,021, filed on Apr. 4, 2002.

(51) Int. Cl.
*G06K 9/40* (2006.01)
*G06K 9/00* (2006.01)

(52) U.S. Cl. .................................... 382/261

(58) Field of Classification Search ............... 382/173, 382/254, 260–264, 255; 375/143, 148, 152, 375/232, 343, 240.29; 704/500; 708/304, 708/322, 520; 370/328, 335, 342, 441
See application file for complete search history.

(56) References Cited

U.S. PATENT DOCUMENTS

| | | | |
|---|---|---|---|
| 5,734,598 A | | 3/1998 | Abott et al. |
| 6,175,588 B1 | | 1/2001 | Visotsky et al. |
| 6,341,180 B1 | * | 1/2002 | Pettersson et al. ........... 382/255 |
| 7,072,928 B2 | * | 7/2006 | Kim ........................... 708/304 |
| 7,085,426 B2 | * | 8/2006 | August ........................ 382/260 |
| 2002/0065664 A1 | | 5/2002 | Witzgall et al. |
| 2002/0136277 A1 | | 9/2002 | Reed et al. |
| 2002/0146178 A1 | * | 10/2002 | Bolle et al. .................. 382/254 |
| 2002/0152253 A1 | | 10/2002 | Ricks et al. |
| 2002/0191568 A1 | | 12/2002 | Ghosh |
| 2003/0227886 A1 | | 12/2003 | Abrishamkar et al. |

FOREIGN PATENT DOCUMENTS

| | | |
|---|---|---|
| WO | WO 00/67389 A | 11/2000 |
| WO | PCT/US03/10180 | 7/2003 |

OTHER PUBLICATIONS

J. S. Goldstein, I. S. Reed and L. L. Scharf, A Multistage Representation of the Wiener filter Based on Orthogonal Projections, IEEE Transactions on Information Theory, vol. 44, No. 7, Nov. 1998.

M. L. Honig, and J. S. Goldstein, "Adaptive Reduced-Rank Residual Correlation Algorithms for DS-CDMA Interference Suppression," In Proc. 32th Asilomar Conference Signals, Systems and Computers, Pacific Grove, CA, Nov. 1998.

(Continued)

*Primary Examiner*—Amir Alavi
(74) *Attorney, Agent, or Firm*—Hogan & Hartson LLP

(57) ABSTRACT

A computationally efficient, adaptive multistage Wiener filter employs two modules, a linear filter module that operates at the input data rate and an update module that operates at a plurality of rates but performs many calculations at only the update rate. This filter is especially useful when the channel conditions vary slowly so that the filter's update rate can be considerably less than the input data rate. Separating the calculations, preferably performing appropriate calculations at different rates and preferably substituting scalar operations for vector operations can provide improved computational efficiency while maintaining high levels of performance.

53 Claims, 21 Drawing Sheets

OTHER PUBLICATIONS

D. C. Ricks and J. S. Goldstein, "Efficient Architectures for Implementing Adaptive Algorithms," Proceedings of the 2000 Antenna applications Symposium, Allerton Park, Monticello, IL, Sep. 20-22, 2000.

J. S. Goldstein and I. S. Reed, "Reduced-Rank Adaptive Filtering", IEEE Transactions on Signal processing, vol. 45, No. 2, Feb. 1997.

M. L. Honig and W. Xiao, "Performance of Reduced Rank Linear Interference," work supported by U.S. Army Research office under grant DAAH04-96-1-0378, Jan. 2001.

D. C. Ricks, P. G. Cifuentes and J. S. Goldstein, "What is Optimal Processing for Nonstationary Data?" Conference Record of the Thirty Fourth Annual Asilomar Conference on Signals, Systems and Computers, Pacific Grove California, Oct. 29-Nov. 2, 2002.

J. S. Goldstein and I. S. Reed, "Performance measures for Optimal Constrained Beamformers," IEEE Transactions on Antennas and Propagation, vol. 45, No. 1, Jan. 1997.

J. S. Goldstein, I. S. Reed, and R. N. Smith, "Low-Complexity Subspace Selection for Partial Adaptivity", Proceedings of IEE Milcom, Oct. 1996.

W. L. Myrick, M. D. Zoltowski and J. S. Goldstein, "Low-Sample Performance of Reduced-Rank Power Minimization Based Jammer Suppression for GPS," IEEE 6$^{th}$ International Symposium Tech. & Appli., NJIT, New Jersey, Sep. 6-8, 2000.

W. Chen, U. Mitra and P. Schniter, "Reduced Rank Detection Schemes for DS-CDMA Communication Systems," private communication, Jan. 2002.

J. Scott Goldstein, et al., "A New Method of Wiener Filtering and its Application to Interference Mitigation for Communications," IEEE, pp. 1087-1091, 1997.

Colin D. Frank, et al., "Adaptive Interference Suppression for the Downlink of a Direct Sequence CDMA System with Long Spreading Sequences," Part of work was presented at the 36$^{th}$ Annual Allerton Conference on Communication, Control and Computing, Monticello, Illinois, pp. 1-31, Sep. 1998.

Samina Chowdhury, et al, "Reduced-Rank Chip-level MMSE Equalization for the 3G CDMA Forward Link with Code-Multiplexed Pilot," Invited Paper for Special Issue of EURASIP Journal on Applied Signal Processing, pp. 1-27, Jul. 2001.

Belkacem Mouhouche, et al., "Chip-Level MMSE Equalization in the Forward Link of UMTS-FDD: A Low Complexity Approach," IEEE, pp. 1015-1019, 2003.

M. Joham, et al., "A New Backward Recursion for the Multi-Stage Nested Wiener Filter Employing Krylov Subspace Methods," pp. 1-4.

Michael L. Honig, "Adaptive Reduced-Rank Interference Suppression Based on the Multistage Wiener Filter," IEEE Transactions on Communications, vol. 50, No. 6, pp. 986-994, Jun. 2004.

* cited by examiner

ADAPTIVE MULTISTAGE WIENER FILTER

PRIORITY CLAIM

This application claims priority from U.S. provisional patent application Ser. No. 60/370,021 filed Apr. 4, 2002.

BACKGROUND

1. Field of the Invention

The present invention relates to the processing of signals in communications systems, in image processing systems and to the processing of signals gathered by various types of sensors such as radar, sonar and other sensor arrays. More particularly, the present invention relates to the equalization and filtering of a signal that has been corrupted by distortion, noise and interference during transmission or otherwise. Implementations of the invention include multistage, adaptive Wiener filters that are computationally efficient.

2. Description of the Related Art

Various applications of the Wiener filter have been proposed. For example, Wiener filters have been used to recover distorted data in the field of image processing. Wiener filters have been applied to communications including, for example, to recover data from a direct sequence code division multiple access (DS-CDMA) transceiver. For many applications, the Wiener filter is the optimal linear filter that minimizes the mean-square error between a desired or transmitted signal and the filter's estimate of that signal. On the other hand, determining the coefficients of the Wiener filter can be computationally burdensome, which reduces the opportunities to use the Wiener filter in many applications in which it could otherwise provide desirable performance.

Conventional applications of Wiener filters input an N-dimensional observed data vector into an N-dimensional vector Wiener filter to extract the desired scalar signal. The generation of an N-dimensional Wiener filter is computationally intensive, with the magnitude of computations needed to calculate and later update the filter coefficients scaling as a power of the dimension N. Consequently, it is desirable to use a reduced rank Wiener filter, one having a dimension less than N, without losing significant accuracy, to process the N-dimensional observed data vector and estimate the scalar transmitted or desired signal. This reduces the complexity of the computations for determining the Wiener filter characteristics. The article, J. S. Goldstein, I. S. Reed and L. L. Scharf, "A Multistage Representation of the Wiener filter Based on Orthogonal Projections," *IEEE Transactions on Information Theory*, Vol. 44, No. 7, November 1998, presents a multistage representation of the Wiener filter (MWF) based on orthogonal projections that can be generated with reduced complexity computations.

According to the Goldstein, et al., paper's strategy, orthogonal projections reduce the rank or dimensionality of the observed data to be input to the Wiener filter (i.e., the projections compress the observed data vector). The projected, reduced dimension observed data vector is then processed in a corresponding, reduced dimension Wiener filter in a manner that makes the filter more computationally efficient and facilitates the accurate estimation of the actual or transmitted data. The Wiener filter architecture is decomposed into multiple stages, so that the resulting Wiener filter is a nested set of scalar Wiener filters that process data and provide the resulting projected data to a final, reduced rank vector Wiener filter. The multistage Wiener filter architecture is well suited to the orthogonal projection of the observed data and facilitates the consequent use of a reduced rank Wiener filter.

Efforts have been made to improve on the multistage Wiener filter described in the paper by Goldstein, et al. An improvement on the Goldstein, et al., multistage Wiener filter is the adaptive filter described in M. L. Honig and J. S. Goldstein, "Adaptive Reduced-Rank Residual Correlation Algorithms for DS-CDMA Interference Suppression," *Proc. 32th Asilomar Conference Signals, Systems and Computers*, Pacific Grove, Calif., November 1998. The paper by Honig, et al., discusses an adaptive version of the multistage Wiener filter known as the ResCor filter due to the filter's use of residual correlations. Here, residual correlation refers to the use of correlation data from processing previous data sets. The ResCor technique facilitates processing because it allows an earlier derived data set to be used in estimating the filter coefficients and hence reduces the requirement that updates to the filter coefficients be calculated at the same time as the filter is processing received symbols. The Honig, et al., paper provides a useful background to the detailed discussion below and so a relevant portion of the article is summarized here.

As with the multiple stage Wiener filter described in the Goldstein, et al., paper, the ResCor filter described by the Honig, et al., paper uses a series of orthogonal projections to reduce the dimensionality of the observed data vectors prior to providing the projected data vectors to the filter. Implementations of the ResCor filter utilize a projection onto a subspace that maximizes the cross-correlation between the "desired-signal" $b_1(i)$ and the "observed-signal" $y(i)$ within the Wiener filter. The resulting ResCor filter is optimal both in terms of minimum mean-square error (MMSE) for a given rank when the covariance matrix is unknown and in terms of subspace tracking in non-stationary environments.

The ResCor strategy can be applied to generate the N×D operator $S_D^H$ that projects a received (N-dimensional) data vector onto the reduced rank (D-dimensional) subspace appropriate to the reduced rank (D-dimensional) Wiener filter. Given a block of M received vectors $y(i)$ and M training (or estimated) symbols $b_1(i)$, $$Y=[y(1), y(2), \ldots, y(M)] \tag{1}$$

$$\bar{b}=[b_1(1), \ldots, b_1(M)], \tag{2}$$

the minimum mean square error (MMSE) filter coefficients can be estimated by simply replacing statistical averages with time or sample averages. Performing this substitution for the ResCor filter "tri-diagonalizes" the (N+1)×(N+1) extended covariance matrix $$\hat{R} = \bar{Y}\bar{Y}^H \tag{3}$$

$$\bar{Y} = \begin{bmatrix} \bar{b} \\ Y \end{bmatrix}. \tag{4}$$

Here and elsewhere in this discussion, the superscript H is used to designate the Hermitian transpose or complex conjugate transpose operation. When D=N, the resulting filter coefficients exactly minimize the least squares (LS) cost function $$\sum_{i=1}^{M} |e(i)|^2$$

where $$e(i)=\hat{b}_1(i)-b_1(i)$$

and $$\hat{b}_1(i)=z(i)$$

For D<N, however, the performance of this filtering strategy can differ substantially from that of the conventional least squares generated filter. That is, the filter requires intensive calculations and the accuracy of the filter, as measured by resulting signal to noise ratio, is generally worse when other than the optimal rank filter is selected.

The coefficients for the Wiener filter may be derived for the ResCor filter by using a training-based block strategy where the coefficients are determined by:

Initialization:

$$d_o = \bar{b}, Y_o = Y \quad (5)$$

For n=1, ..., D (forward recursion):

$$p_n = Y_{n-1} d^H \quad (6)$$

$$\delta_n = \|p_n\| \quad (7)$$

$$h_n = p_n / \delta_n \quad (8)$$

$$d_n = h_n^H Y_{n-1} \quad (9)$$

$$B_n = \text{null}(h_n) \quad (10)$$

$$Y_n = B_n^H Y_{n-1} \quad (11)$$

Decrement n=D, ..., 1 (backward recursion):

$$\omega_n = (\omega_n d_{n-1}^H) / \|\omega_n\|^2 = \delta_n / \|\epsilon_n\|^2 \quad (12)$$

$$\epsilon_{n-1} = d_{n-1} - \omega_n^* \epsilon_n \quad (13)$$

where $\epsilon_D = d_D$.

In the above discussion, the null(h) operator produces a matrix that can project a vector into the null space defined by the vector h. The blocking matrix operator $B_n$ is used to block the contributions of portions of the data vector to facilitate the decomposition of the Wiener filter. The choice of blocking matrices $B_n$, n=1, ..., D, does not affect the minimum mean-square error (MMSE), although the choice of blocking matrix can affect performance for a specific data record. The estimate of the block of transmitted symbols is $$\hat{b} = \vec{\omega}_1^* \vec{\epsilon}_1.$$

The adaptive Wiener filter can be used in a wide variety of applications with a variety of levels of assumptions on the nature of the signals. If all signals are known, as would be the case when a training sequence is provided to the filter, then the filter can be implemented as detailed above. Similarly, if known pilot symbols are transmitted with data, the filter can be updated employing the pilot symbols as they occur. Often in practice the Wiener filter is not provided an explicit training signal. This can be overcome in many smoothing problems or in many communications problems by utilizing, for b, a signal that corresponds to the received data after data decisions have been made on the filter output in the well-known decision-directed mode of adaptation. Another blind version of the preceding strategy for deriving the filter coefficients for CDMA communications can be obtained simply by substituting $s_1$ (the spreading code for the desired user) for $p_1$ in the preceding coefficient generation discussion. In addition, in an array processing environment prior knowledge of the direction of the desired signal could be captured with a steering vector, $s_1$, and this steering vector could also be used for $p_1$ in coefficient generation. In both of these preceding cases this would imply that the first stage of the filter is not adaptive but that the remainder of the algorithm proceeds as detailed above. It should be noted that, for these versions incorporating a non-adaptive first stage, the resulting set of forward recursions does not exactly tri-diagonalize the extended sample covariance matrix. Consequently, these versions may not perform as well as a training-based version with all stages adaptive.

The computations required to determine the coefficients of the Wiener filter in the preceding discussion for small D are modest in comparison with reduced-rank techniques that require the computation of eigenvectors or inversion of the sample covariance matrix $$\bar{R} - YY^H.$$

Nevertheless, determining the coefficients for the Wiener filter of the Honig, et al., paper is relatively expensive as compared to less effective but also less expensive filters and equalizers currently employed in many applications.

The adaptive multistage Wiener filter described in equations above is generally illustrated in FIG. 1, which is the implementation of a conventional multistage Wiener filter shown in FIG. 2 of the article, D.C. Ricks and J. S. Goldstein, "Efficient Architectures for Implementing Adaptive Algorithms", Proceedings of the 2000 Antenna Applications Symposium, Allerton Park, Monticello, Ill. Sep. 20–22, 2000. The Ricks, et al., implementation is essentially the multistage Wiener filter of Honig, et al., discussed above. It should be noted in FIG. 1 the linear filter blocks represent the vector operations $$d_i = h_i^H \vec{y}_{i-1}.$$

A linear filter component of a multistage Wiener filter is illustrated in FIG. 1(a) and includes a set of linear filter elements h1 and h2 along a forward recursion path within the linear filter. The first filter element h1 may, for example, be a matched filter that represents a zero order or a priori channel characterization. This first filtering is equivalent to projecting the input data vectors onto a steering vector $\bar{s}$. This was the implementation proposed by Ricks, et al. In the Ricks, et al., configuration, the d output by the h1 filter element (labeled $\bar{s}$ in their article) is the first projection of the input data vector along the direction of the filter's steering vector. That first d estimate is projected back to the original data vector by the $h_1'$ filter element and that estimate is subtracted from the data vector $\vec{y}_0$ to provide the vector $\vec{y}_1$.

The vector $\vec{y}_1$ is a first estimate of the interference in the received data vector. As with other multistage Wiener filters, the Ricks, et al., multistage Wiener filter focuses on the most significant portion of the interference and provides successive estimates of the successively less important interference sources in additional stages of the filter.

Thus, the next filter element $h_2$ is used to estimate the first interference source. The resulting output of the $h_2$ filter element is then projected back onto the data vector direction and the first interference estimate is subtracted from the vector $\vec{y}_1$ to produce a new vector $\vec{y}_2$ that should be dominated by a second interference source. Successive stages function in a similar way to that described for the $h_2$ filter element. In the linear filter illustrated in FIG. 1(a), the succession of stages is truncated after a desired number of stages that might, for example, represent a computationally desirable approximation of the Wiener filter. This truncation is illustrated in FIG. 1(a) by the terminator.

The backward recursion illustrated in FIG. 1(a) and described in equations 12 and 13 above is then performed to generate the scalar filter output $$z = \omega_1^* \epsilon_1.$$

that represents the estimate of the signal corresponding to the current transmitted symbol, with the various interference estimates subtracted along the backward recursion path according to the equivalent weight vector $\vec{\omega}$ illustrated by the collected gain elements shown in FIG. 1(a). FIG. 1(b) shows the calculations used to adapt the filter coefficients h and the filter weights. The element indicated by ||(.)|| in FIG. 1(b) represents the calculation of a vector magnitude. These calculations are performed at the symbol rate over, for example, a block to generate an update to the filter coefficients and the filter weights at the update rate.

From the FIG. 1 illustration and the equations and discussion above of the Honig, et al., filter, the computational complexity can be determined for D filter stages, data vector lengths of N, and data blocks of size M. Here, the computational complexity is given as the total number of scalar arithmetic operations to update the filter and is given by: 10DNM+5DM+5NM. For example, where D=10, N=100 and M=1000, the complexity of the FIG. 1 filter is $1.055*10^7$. It would be desirable to achieve the performance of the multistage adaptive Wiener filter at a reduced computational cost.

SUMMARY OF THE PREFERRED EMBODIMENTS

An aspect of the invention provides a method of processing data through a multistage adaptive Wiener filter including providing input data to a linear filter module. The linear filter module includes a plurality of filter stages characterized by a first set of linear filter coefficients, the linear filter module is further characterized by a first set of filter weights, and the linear filter module processes input data at a filter data rate. The method includes adjusting a set of filter parameters at a filter update rate, wherein the filter data rate is greater than the filter update rate so that the linear filter module functions as an adaptive Wiener filter.

Another aspect of the present invention provides a multistage adaptive Wiener filter, comprising a linear filter module operating at a filter data rate and receiving symbols from a channel. An update filter module is coupled to receive signals from the linear filter module and provide updated filter coefficients to the linear filter module. The updated filter coefficients are characteristic of the channel from which the symbols are received, the update filter module providing updated filter coefficients at a filter update rate so that the linear filter module functions as an adaptive multistage Wiener filter.

Still another aspect of the present invention provides an adaptive multistage Wiener filter. The filter includes a linear filter module having first and second linear filter elements connected to receive an input data set in common at inputs to the first and second linear filter elements. The first and second linear filter elements perform distinct filtering operations on the input data set. The first linear filter element outputs first filtered data and the second linear filter element outputs second filtered data. At least one weighting element and at least one combining element are provided within the linear filter module. The second linear filter element provides the second filtered data to the at least one weighting element and the weighting element outputs weighted second filtered data. The combining element is responsive to the weighted second filtered data and the first filtered data to output combined filtered data. An update module is coupled to the linear filter module to provide updated filter coefficients to the first and second filter elements. The update module determines updated filter coefficients based on at least in part a cross correlation between the input data and filtered data.

In this immediately preceding aspect, there may be additional linear filter elements like the second filter element so that third and fourth adaptive filter elements might be utilized in certain preferred embodiments.

Yet another aspect of the present invention provides an adaptive multistage Wiener filter including a linear filter module comprising first and second linear filter elements connected to respectively receive first and second input data. The first and second linear filter elements perform distinct filtering operations. The first linear filter element outputs first filtered data and the second linear filter element outputs second filtered data. The second linear filter element provides the second filtered data to at least one weighting element and the weighting element outputs weighted second filtered data. The combining element is responsive to the weighted second filtered data and the first filtered data and outputs combined filtered data. An update module is coupled to the linear filter module to provide updated filter coefficients to the first filter element, the update module determining updated filter coefficients based in part on a cross correlation between the input data and filtered data and at least in part an autocorrelation of the filtered data.

BRIEF DESCRIPTION OF THE DRAWINGS

Preferred embodiments of the present invention are described here with reference to the accompanying drawings, wherein like numerals denote like elements. The drawings and this description of them form a part of this disclosure.

FIGS. 6–8 illustrate components of the FIG. 4 update module composed of multipliers and accumulators that operate at the data rate. These components perform the statistical estimates of the signal parameters that are passed to the update clocked sub-module of FIG. 9.

DETAILED DESCRIPTION OF THE PREFERRED EMBODIMENTS

Figure 1A:
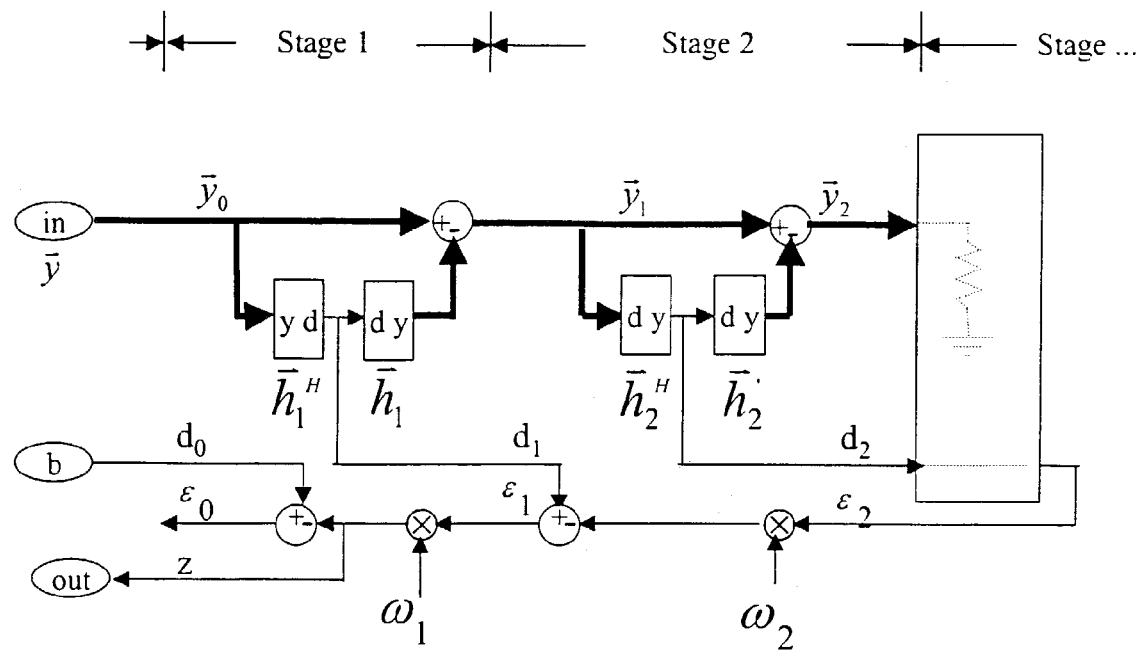
FIG. 1 illustrates a conventional multistage Wiener filter, including a linear filter stage shown in FIG. 1(a) and the update filter portion shown in FIG. 1(b) that updates the parameters of the linear filter.

Preferred embodiments of the present invention provide computationally efficient Wiener filters. Certain preferred embodiments provide computationally efficient, adaptive multistage Wiener filters (MWF) that are especially useful when the update rate for the adaptive portion of the filter can be considerably less than the input data rate. The general filter architectures described here are especially efficient when the size of the data input vector is large. In a preferred aspect, the adaptive multistage Wiener filter may employ two modules, a linear filter module that operates at the input data rate and an update module that operates at both rates but performs many calculations at only the update rate. Separating the calculations, preferably performing appropriate calculations at different rates and preferably substituting scalar operations for vector operations can each, independently provide improved computational efficiency while maintaining high levels of performance. Presently most preferred embodiments include all of these strategies.

In other preferred embodiments of the invention, the multistage Wiener filter architecture can be implemented in a sampled update fashion. If the channel (the varying parameters that distort and corrupt the data) is varying slowly there is little benefit to updating the filter coefficients too often. It is desirable to perform filter update calculations at a rate close to what is needed for accuracy and so filter update calculations are preferably performed in this implementation using a sample of data and the filter update is performed infrequently compared to the data rate. The filter coefficients calculated from the sample are employed for a long time before a new sample of data is obtained and used to again calculate the filter update coefficients. This implementation of the multistage Wiener filter therefore preferably employs three data calculation rates: first, the data rate of the filter that provides the filtered data; second, the update rate of the calculations of new filter coefficients; and third, the sample rate at which samples of data blocks are taken to provide for the update calculations.

For the sampled update implementation of the multistage Wiener filter architecture, the basic filter structure that operates at the data rate can be simplified to a form that is no more complex than a simple matched filter. This can make the new adaptive multistage Wiener filter cost competitive with the lower performance matched filters and equalizers widely employed today in nearly all communication and signal processing applications.

Certain of the improvements discussed here are applicable in multistage Wiener filters when update calculations are made at the data rate. Aspects of the invention, discussed below, in which certain vector multiplies and subtractions are avoided, provide simplified calculations and circuitry regardless of whether the filter is used within a slowly changing or a rapidly changing environment. These simplifications generally benefit multistage Wiener filters and can be advantageously applied to such filters. In some implementations these Wiener filters allow a level of parallelism that is not typically permitted by the Wiener filters discussed in the background. The use of parallelism is an advantage in itself, but is not a requirement for these simplifications to be useful in Wiener filters.

As discussed above, a Wiener filter is a linear filter that minimizes the mean-square error between a desired or transmitted signal and the filter's estimate of that signal. As will be apparent from the discussion of Wiener filters in the background above, the term Wiener filter has come to include adaptive structures and combinations of adaptive and non-adaptive (e.g., matched filter) elements within the filter. The term multistage Wiener filter is also used here. As used, the term multistage Wiener filter is intended to include two or more linear filter stages, with signals provided to the filter stages either serially, as is illustrated in the discussions of the background, or preferably in parallel, as illustrated below. A multistage adaptive Wiener filter includes two or more linear filter stages where at least one of the stages is an adaptive stage. Those of ordinary skill will appreciate that under some implementations the number of adaptive stages will vary and may be determined by the filter itself. The Wiener filters discussed here and in the references discussed in the background are often approximations to the ideal Wiener filter. It should further be understood that a Wiener filter as described here may be a subsystem or component of a larger filtering strategy or system and so not all of the elements of a filter need to be consistent with a Wiener filter to implement aspects of the present invention.

Generally, aspects of the present invention will find application where a reduced rank, multistage Wiener filter finds application, including those applications discussed in the articles referenced in the background of this description. Wiener filters according to the present invention may find application in communications systems, including in systems that incorporate space-time processing. Other applications include image processing, whether in improving or recovering image data from a noisy or distorted imaging array. Imaging applications include, for example, those using magnetic resonance detection, various x-ray imaging systems, sonar, radar and other applications that use one, two or more dimensional arrays (whether displaced physically or in time) for gather data about a system. Still other applications include in speech processing, whether improving a sample or received speech signal or in filters used for recognizing speech. As such, the applications of at least aspects of the present invention are believed to be broad.

Much of this discussion is made in terms of filters including a linear filter module and an update filter module. These terms are intended to reference the logical and functional characteristics of the circuit elements within these modules. It is not necessary that these circuit elements be physically separated or that these circuit elements be dedicated to these functions under all operating conditions. Dedicated circuitry can certainly be used and it is presently anticipated that, even when implemented within general purpose circuitry such as a digital signal processor, the linear filter and update modules will primarily constitute dedicated circuitry during filter operations.

Particularly preferred implementations of the adaptive multistage Wiener filter may employ two modules, a linear filter module that operates at the input data rate and an update module that operates at both the data and update rates but performs many calculations at only the update rate. The rate of performing certain calculations preferably is reduced in this implementation to a level corresponding to how quickly certain channel characteristics vary. Another aspect of the present invention improves the efficiency of the conventional multistage adaptive Wiener filter by reorganizing both the linear part of the filter and the adaptation part of the filter. The improvement in efficiency occurs in part because the linear part of the filter that operates at the data rate is simplified while the adaptation part that operates at the slower update rate performs a more complex calculation to compensate for the reduction in the complexity of the linear filtering part.

A discussion of the strategy employed here begins with an explanation of the ResCor filter illustrated and introduced in the discussion above. Starting with the ResCor filter as described given above, a preferred embodiment simplifies the update calculations by replacing the ensemble average of the filter coefficients with a sample average over the previous block. This includes $$\vec{p} \text{ and therefore } \vec{h} = \vec{p}/\|\vec{p}\|,$$

$\|\epsilon\|^2$ and $\omega$ as well. Replacing each of these quantities with a sample average over the previous block relies on the assumption that the channel is changing slowly so that the filter coefficients calculated in the previous block are sufficiently valid for the current block.

Second, the blocking matrix suggested by M. L. Honig and J. S. Goldstein, "Adaptive Reduced-Rank Residual Correlation Algorithms for DS-CDMA Interference Suppression," *Proc. 32th Asilomar Conference Signals, Systems and Computers*, Pacific Grove, Calif., November 1998, is adopted:

$$B_n = [I] - \vec{h}\,\vec{h}^H.$$

There is no need to reduce the rank for this blocking matrix, but that could be done if desired. Such a reduced rank, blocking matrix is not illustrated here.

Now this discussion illustrates the effect of these modifications on the filter and its operation, using the same definitions and nomenclature as are used in the background, except the lower case y is used in place of upper case Y. The superscript H indicates the Hermitian transpose for matrix operators and the superscript * indicates the conjugate transpose of a vector. The forward recursion update of the filter coefficient calculations begins from Equation 6 quoted above:

$$\vec{p}_n = \vec{y}_{n-1} d_{n-1}^H$$

Now following the advice given by Honig, et al., [B] is replaced with $[B] = [I] - \vec{h}_n \vec{h}_n^H$:

$$\vec{y}_n = ([I] - \vec{h}_n \vec{h}_n^H)\vec{y}_{n-1} = (\vec{y}_{n-1} - \vec{h}_n(\vec{h}_n^H \vec{y}_{n-1}))$$

and $$\vec{h}_n = \vec{p}_n/\delta_n$$

$$d_n = \vec{h}_n^H \vec{y}_{n-1}$$

but $$\vec{h}^H \vec{y}_{n-1} \text{ is just } d_n, \text{ thus } \vec{y}_n = \vec{y}_{n-1} - \vec{h}_n d_n = \vec{y}_{n-1} - d_n \vec{h}_n.$$

This specific result is just that shown in the article, D. C. Ricks and J. S. Goldstein, "Efficient Architectures for Implementing Adaptive Algorithms", Proceedings of the 2000 Antenna Applications Symposium, Allerton Park, Monticello, Ill. Sep. 20–22, 2000. This is the multistage adaptive Wiener filter shown in FIG. 1.

Calculating $\omega$, h, and p only once per block (that is, using sample averages) improves the pipelined, recursive filter calculation and the assumption requires only that channel variations are relatively slow. Now, in accordance with a preferred embodiment of the present invention, the two different calculation rates are implemented in a filter that is split into two corresponding major parts: a linear filter that operates at the symbol rate and an adaptive part in which, for example, filter weighting coefficients are calculated. In a preferred implementation, the update calculations of the adaptive part are performed only at the update rate. The weighting coefficient calculation rate could be only 0.1 to 0.001 of the symbol rate. This rate need be only high enough to follow the channel parameter variations, and need not be performed at the symbol rate. As such, different implementations of the present multistage Wiener filter might utilize different rates for updating the weighting coefficient calculation, reflective of the different rates at which channel conditions vary.

Figure 2:
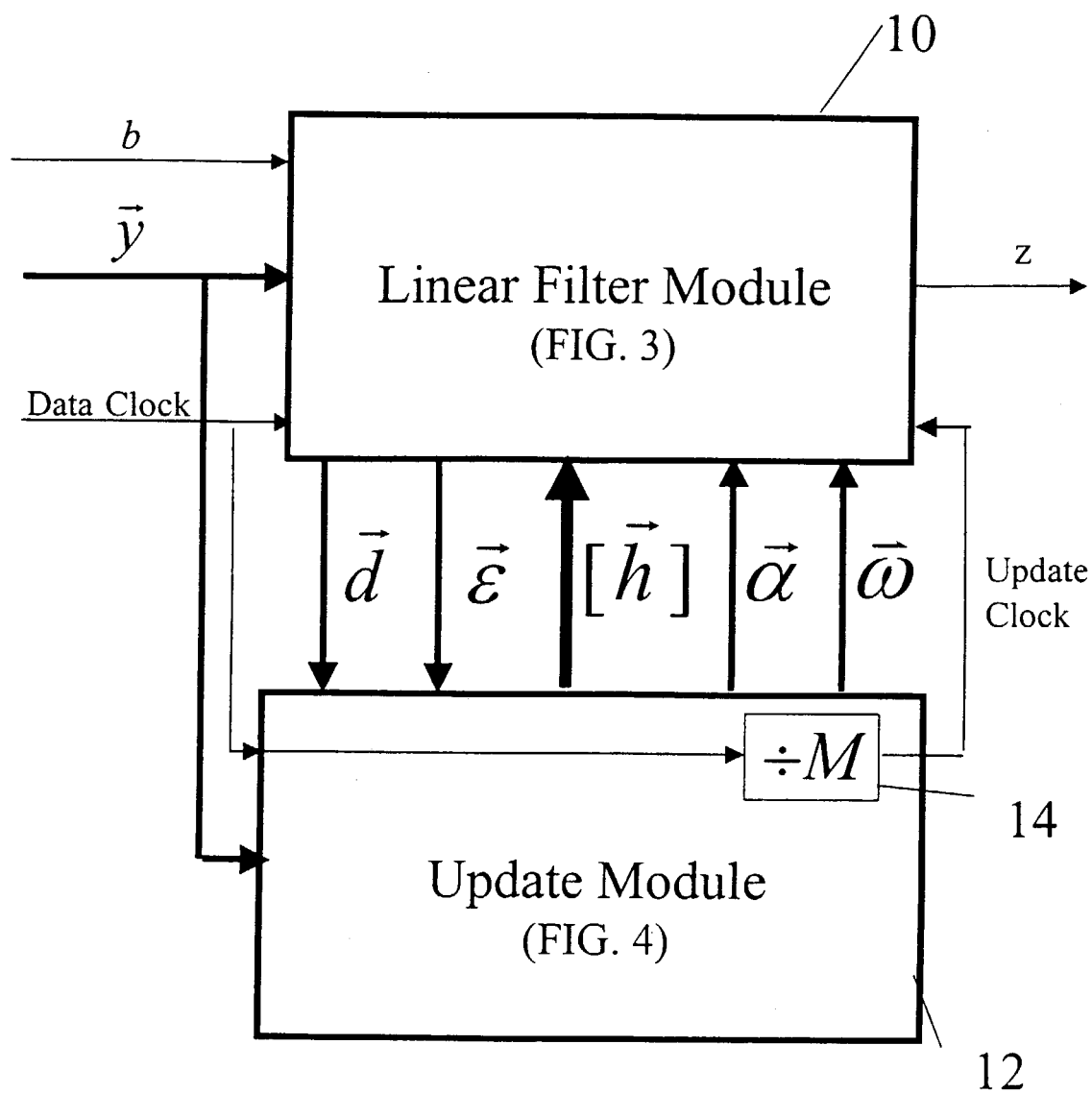
FIG. 2 illustrates an adaptive multistage Wiener filter in accordance with the present invention and having a linear filter and an update module. The linear filter module receives input data vector y at the input data rate and produces scalar output z at the same rate. The linear filter module receives update coefficients from the update module at the update rate and provides vector output $\epsilon$ and data vector d to the update module at the data rate. The first update module receives vectors y and d at the data rate and provides vectors $\alpha$, $\omega$ and matrix h at the update rate.

FIG. 2 illustrates an adaptive multistage Wiener filter having a linear filter part and an adaptive part in accordance with an embodiment of the invention. The FIG. 2 adaptive multistage Wiener filter includes a linear filter module 10 and a filter coefficient update module 12. At each symbol clock tick a new observed data vector y(m) enters the filter and update modules and an old filter output value z(m−1) exits the linear filter module. In this particularly preferred illustration, the symbol rate clock is divided by circuitry 14 associated with the update module 12 to obtain the filter update rate. In many instances, the practical effect of this method of determining the filter coefficient update rate will be that the sample clock rate will be an integer multiple of the update rate. In the discussion that follows, some extra work is done because the filter is split into two parts. In a particularly preferred further implementation, some calculations are shared between the filter and update modules to eliminate the extra work.

Referring now to FIG. 2, the multistage adaptive Wiener filter is illustrated as including a linear filter module 10 and an update module 12 used to determine the update coefficients for the linear filter module 10. Observed data samples and the symbol data clock are input to both modules. Circuitry is arranged within the linear filter module of FIG. 2 to preferably place calculations that can be performed at the update calculation rate into the update calculation module 12. Note that $\vec{y}_n \cdot \vec{h}_n = \vec{h}_n^H \cdot \vec{y}_n$ and that this notation is used to indicate linear filtering. When an input vector $\vec{y}$ passes through a filter element $\vec{h}_0$, the resulting initially filtered signal is $d_1 = \vec{y} \cdot \vec{h}_0 = \vec{h}_0^H \cdot \vec{y}$. The linear filter can be derived as follows:

$$d_n = \vec{h}_n^H \vec{y}_{n-1} = \vec{y}_{n-1} \cdot \vec{h}_n \quad \vec{y}_n = \vec{y}_{n-1} - \vec{h}_n d_n \quad a_{in} = \vec{h}_i \cdot \vec{h}_n$$

$$d_0 = \vec{y} \cdot \vec{h}_0 \quad d_1 = \vec{y}_0 \cdot \vec{h}_1$$

$$d_2 = \vec{y}_1 \cdot \vec{h}_2 = (\vec{y}_0 - \vec{h}_1 d_1) \cdot \vec{h}_2 = \vec{y}_0 \cdot \vec{h}_2 - d_1 \vec{h}_1 \cdot \vec{h}_2$$

$$= (\vec{y} - h_0 d_0) \cdot \vec{h}_2 - \alpha_{12} d_1 = \vec{y} \cdot \vec{h}_2 - \alpha_{12} d_1$$

$$d_n = \vec{y} \cdot \vec{h}_n - \sum_{i=0}^{n-1}(\vec{h}_i \cdot \vec{h}_n)d_i = \vec{y} \cdot \vec{h}_n - \sum_{i=1}^{n-1} \alpha_{in} d_i$$

Here, α is the covariance matrix of the h (linear filter element) vectors.

Linear Filter Module $\vec{y}$ (m) is the input to the filter $\vec{\alpha}, \vec{h}$ are provided by the update module z(m) is the output of the filter.

$$d_n = \vec{y} \cdot \vec{h}_n - \sum_{i=0}^{n-1} \alpha_{in} d_i$$

$\epsilon_D = d_D$ $\epsilon_{n-1} = d_{n-1} - \omega_n^* \epsilon_n$ $z = \omega_1^* \epsilon_1$.

Figure 3:
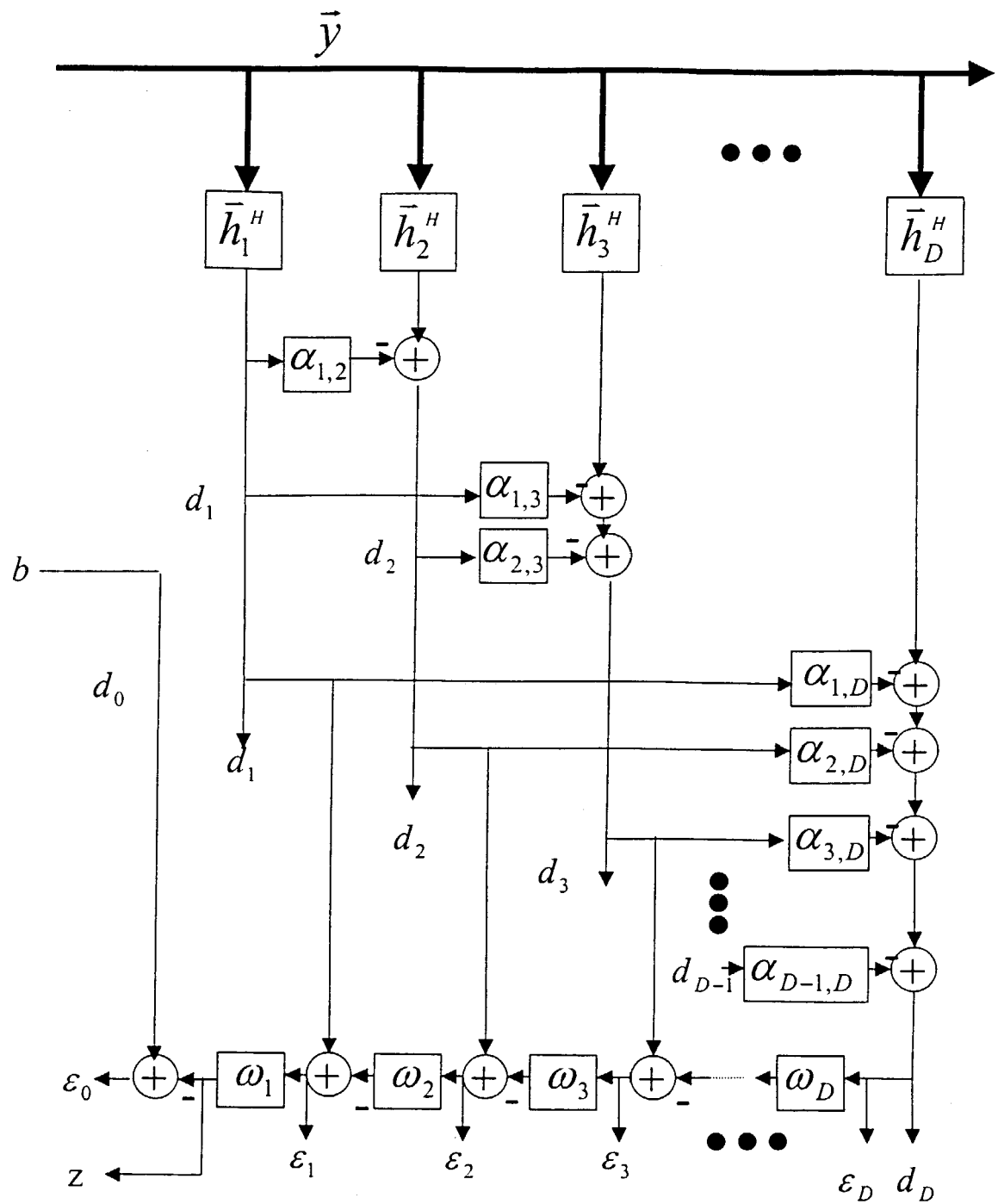
FIG. 3 illustrates a linear filter module for use with the filter of FIG. 2. The linear filter receives vector y as an input and provides z as its output. The module also provides the vector d and the vector $\epsilon$ to the update module and receives the vectors $\alpha$, $\omega$ and matrix h from the update module.
Figure 4:
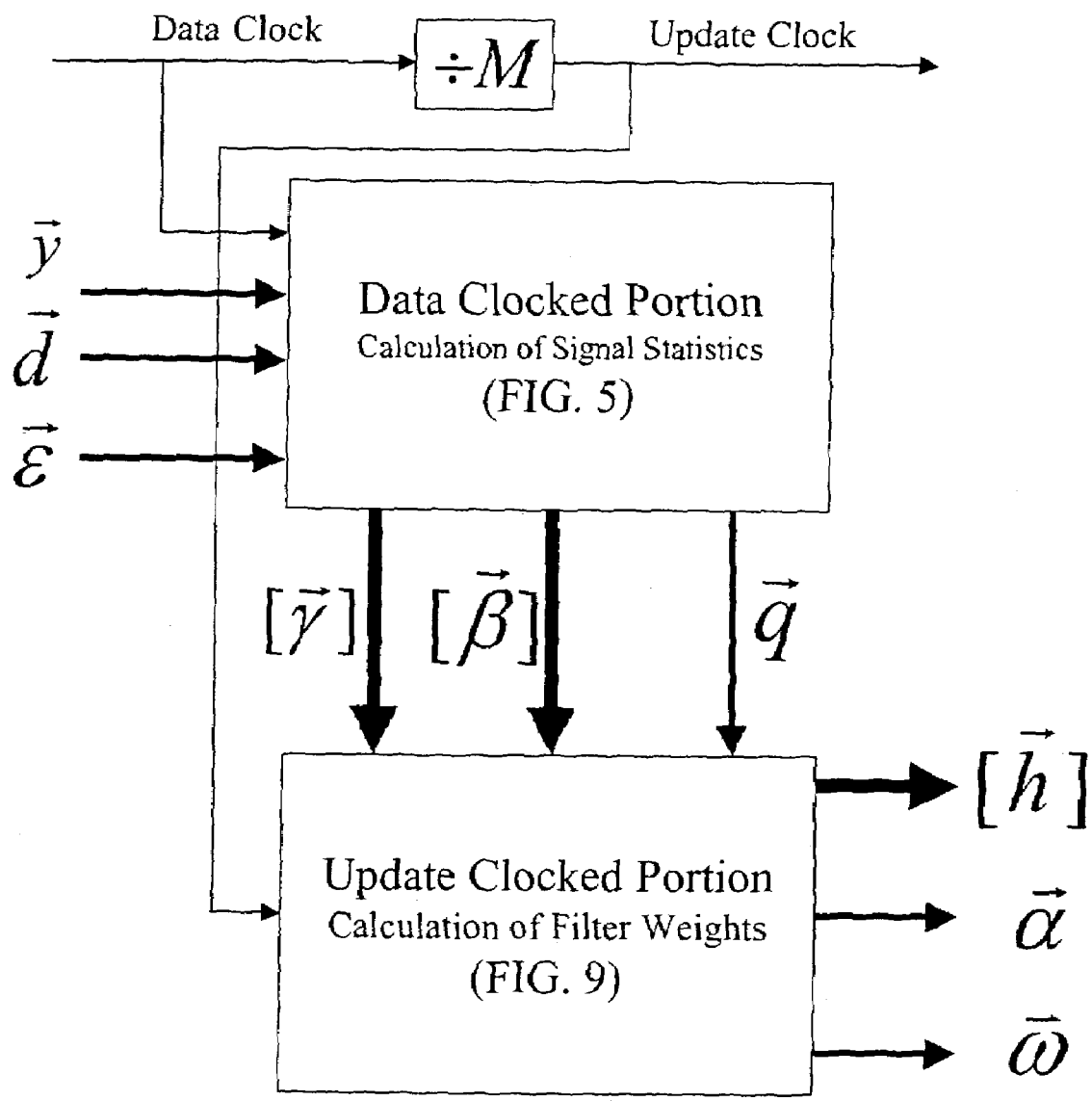
FIG. 4 shows an update module for use in the filter of FIG. 2. The FIG. 4 update module receives the vectors y, d and $\epsilon$ and outputs the matrix h and vectors $\alpha$ and $\omega$. The FIG. 4 update module generates the update clock at the end of each data block. The data clocked sub-module operates at the data clock rate and the update sub-module is clocked at and operates at the update clock rate.

FIG. 3 illustrates a preferred embodiment of the linear filter module represented in the above equations. The illustrated circuitry closely corresponds to the above-discussed calculations, with FIG. 3 also providing a graphical demonstration of certain of the terms used in the calculations and their relations to others of the terms. The linear filter module illustrated in FIG. 3 represents a considerable computational simplification over the ResCor linear filter module described in the paper by Honig, et al., and the filter structure described in the paper of Ricks, et al., because the linear filter module of FIG. 3 calculates at the signal sample rate, but the filter coefficients, etc., are only calculated at the update rate.

Another significant improvement achieved by this strategy and implementations of this strategy is the avoidance of a number of vector calculations that are required by the filters of either of the Honig, et al., or the Ricks, et al., strategies. This improvement may be achieved even without separating the filtering calculations from the update calculations. The improved efficiency can be seen in the linear filter module calculations for the FIG. 3 module given above as compared to either of the Honig, et al., or the Ricks, et al., formulations. The preferred linear filter portion shown in FIG. 3 does not perform the scalar-vector multiplication $d_n^* \vec{h}_n$ and the vector—vector subtraction operation of this resulting vector from $\vec{y}_{n-1}$ in each of the D stages of the linear part of the filter. This is significant since the vector length N may be one hundred or more but D may only be three or four for many applications. This improvement is also evident in comparing FIG. 1 to FIG. 17.

While the conventional $d_n^* \vec{h}_n$ and $\vec{y}_{n-1} - (d_n^* \vec{h}_n)$ operations are avoided in the Wiener filter of FIG. 2, the FIG. 2 Wiener filter replaces those calculations with autocorrelation calculations between the d vector and scalar subtractions of the form $(\vec{h} \cdot \vec{y}) - (d_{n-1} \alpha_{j,d-1})$ (FIG. 3). Thus, the update calculation is made more complex but it is performed less often in the FIG. 2 filter. In the further simplified filters illustrated in FIGS. 13 and 18, no extra calculations are added to the linear filter modules, but additional calculations are needed in the update modules.

Filter Update Calculation

Figure 8:
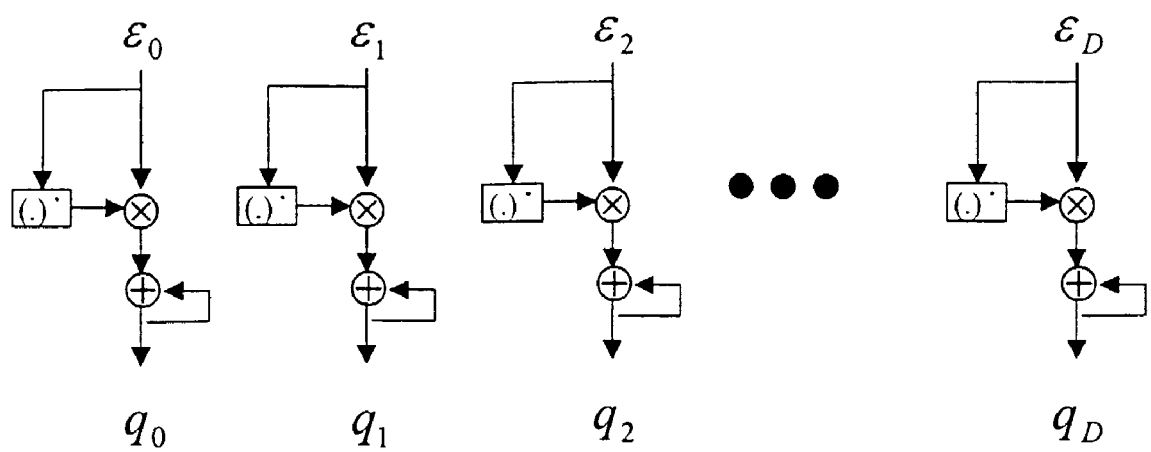

The filter update module adaptively determines the characteristics of the filter elements and the filter weights in part through cross correlations between the input data vector $\vec{y}$ and the filtered data vector $\vec{d}$. This cross correlation between $\vec{y}$ and $\vec{d}$ followed by summing is performed in the circuitry illustrated in FIG. 6 to calculate the $\vec{y}$ vector shown in FIG. 6. This calculation might be somewhat likened to the one done in the filter update module illustrated in FIG. 1(b), but in the filter update module 12 of FIG. 2 additional operations are done. The FIG. 2 update module determines the covariance of the $\vec{d}$ vector to calculate the β matrix, see FIG. 7, which allows this function to be taken out of the linear filter portion of the filter. FIG. 8 illustrates the calculation of the q vector.

The filter update module 12 shown in FIG. 2 most preferably calculates and updates filter coefficients and weights at a slower rate than the symbol rate. In fact, the illustrated preferred filter update module calculates averages from the data that arrives at the symbol rate. The ensemble averages of the data that arrives at the symbol rate are replaced with time averages and these time averages are indicated here with angle brackets. For example <X> represents such a time average. <X> can be either incrementally updated or block updated, as illustrated in the following sets of equations.

Incremental Update $$<X>_{new}=(1-\mu)<X>_{old}+\mu X$$

Thus, the value of <X> is updated, for example, on a sample by sample basis with the calculation of <X> weighted with an update factor μ.

Block Update $$<X>=\frac{1}{M}\sum_{m=1}^{M}X_m$$

so that the value <X> is calculated once for each received block of sampled data. Now from the equations above, $$\vec{p}_n=<\vec{y}_{n-1}d^*_{n-1}> \text{ and } \vec{y}_n=\vec{y}_{n-1}-d_n\vec{h}_n$$

$$\vec{y}_0=\vec{y} \quad d_0=\vec{b}$$

$$\vec{p}_1=<\vec{y}_0 d_0^*>$$

$$\vec{p}_2=<y_1 d_1^*>=<(\vec{y}_0-\vec{h}_1 d_1)d_1^*>=<\vec{y}_0 d_1^*>-\vec{h}_1<|d_1|^2>$$

$$\vec{p}_n = <\vec{y}d^*_{n-1}>-\sum_{i=0}^{n-1}<d_i d^*_{n-1}>\vec{h}_i$$

Since the $\vec{h}$'s are updates from the $\vec{p}$'s as $\vec{h}_{new} \leftarrow \vec{p}/\delta$, a more accurate estimate of $\vec{p}_n$ is:

$$\vec{p}_n = <\vec{y}d_{n-1}>-\sum_{i=0}^{n-1}<d_i d^*_{n-1}>\vec{p}_i/\delta_i \text{ where } \delta_i=\|\vec{p}_i\|$$

$$\vec{h}_n=\vec{p}_n/\delta_n \text{ where } \delta_n=\|\vec{p}_n\|$$

$$\beta_{ij}=<d_i d_j^*>; \quad \vec{p}_1=<\vec{y}d_0^*>-\vec{h}_0<|d_0|^2>; \quad \vec{\gamma}_i=<\vec{y}d_j^*>$$

Now $$\vec{p}_n = \vec{\gamma}_{n-1}-\sum_{i=0}^{n-1}\beta_{i,n-1}\vec{h}_i$$

Figure 5:
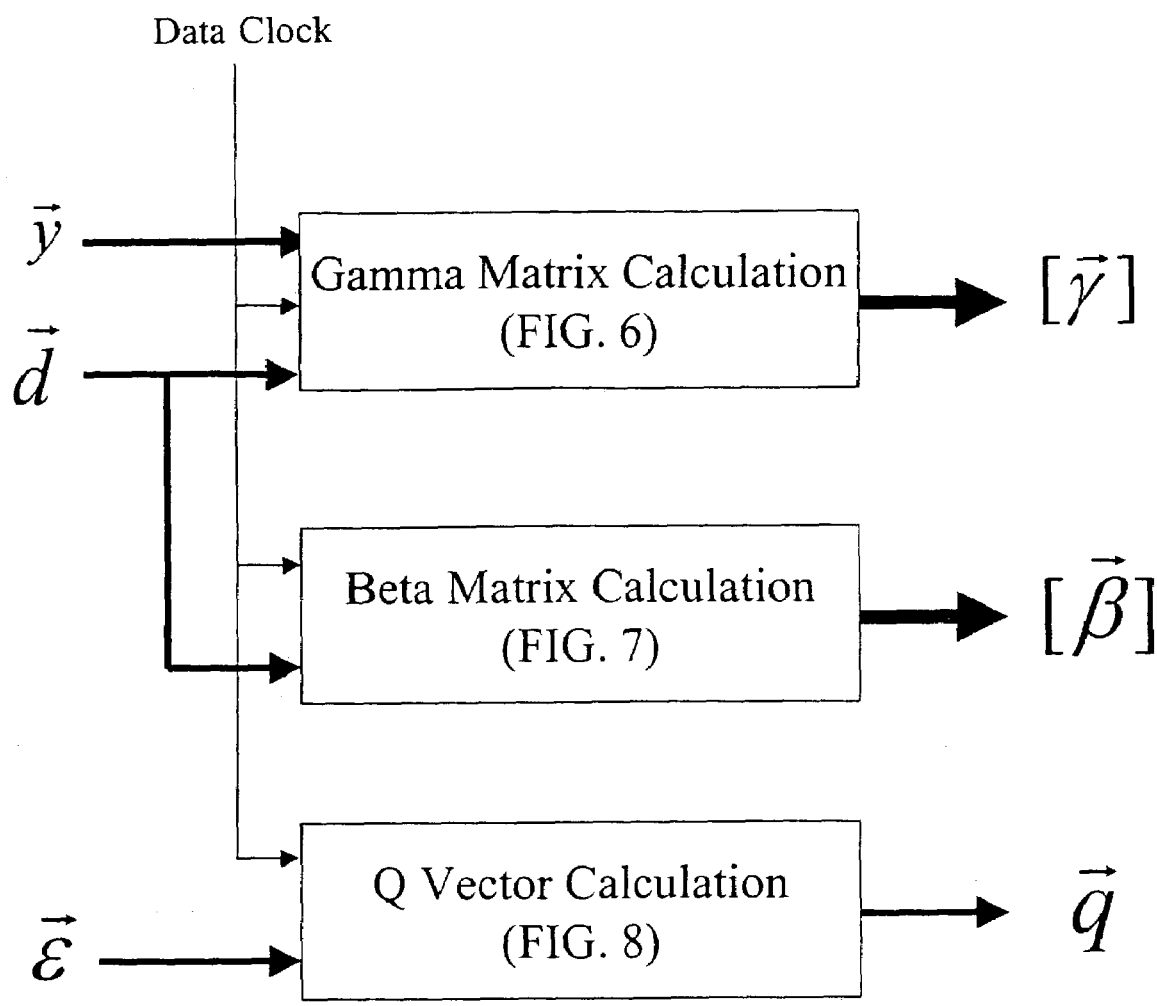
FIGS. 5–8 show that part of the update module of FIG. 4 that is clocked at the data rate.
Figure 6:
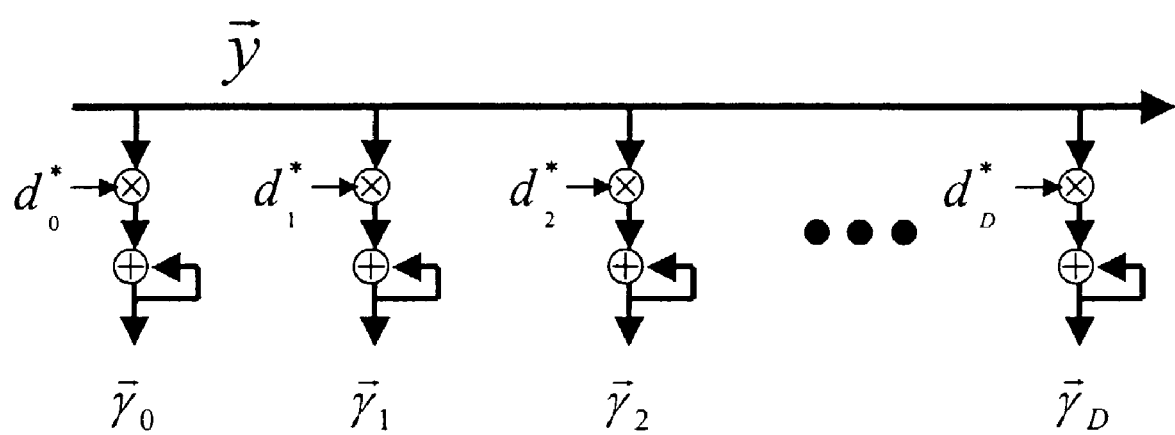
Figure 7:
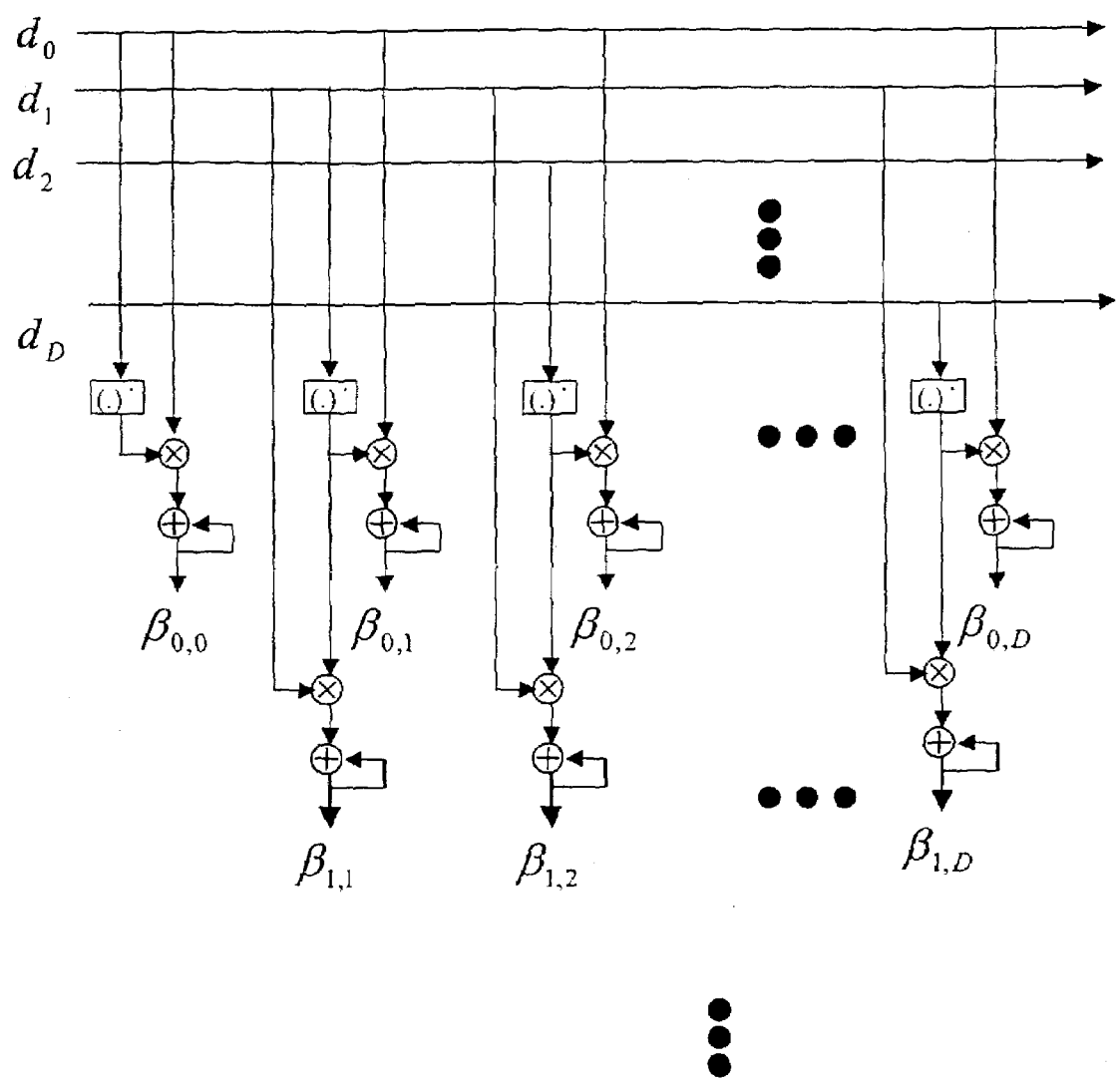

The circuitry for performing these filter coefficient update calculations is illustrated in FIGS. 4–7 with the various interconnections between these circuit blocks extending between the sheets showing these figures. FIG. 5 illustrates that portion of the filter weight calculation that is preferably performed at the data rate. The circuitry illustrated in FIGS. 4–8 might be implemented in a variety of ways, including within a digital signal processor (DSP), within dedicated circuitry or within a combination of dedicated circuitry and general-purpose circuitry such as microprocessor or DSP cores. The rest of the circuitry described above and below may similarly be implemented in a variety of different fashions.

FIGS. 5–8 collect those portions of the update module 12 (from FIG. 2) that operate at the data clock rate at which the linear filter module 10 operates. FIGS. 9–12 collect those portions of the update module 12 that operate at the update clock rate, which is considerably slower than the data clock rate. Note in FIG. 10, element 16 is used to determine the magnitude of a vector quantity. The output of that element is provided to a division element 18 that normalizes the magnitude to the unit length. As discussed above and as is illustrated in FIG. 2, the update clock rate is preferably obtained by dividing the data clock rate so that the update clock rate might be on the order of 0.1 to 0.001 of the data (symbol) rate. The illustrated filter is then operated as follows.

Update Module $$\vec{y}(m)$$

is an input to the module.

$$\vec{d}(m)$$

is an input to the update module from the filter module.

At the input data rate calculate for n=0, 1, . . . D $$q_n=<\|\epsilon_n\|^2>$$

for all i, j=0, 1, . . . D, calculate $$\beta_{ij}=<d_i d_j^*>$$

$$\vec{\gamma}_i=<\vec{y}d_i^*>$$

These portions of the filter are illustrated in FIGS. 5–8. As illustrated, these data clocked portions of the update module (FIG. 4) represent the signal statistics calculations. At the update rate, the FIG. 9 portions of the update module preferably calculate for all n=0, 1, . . . D $$\vec{p}_n = \vec{\gamma}_{n-1}-\sum_{i=0}^{n-1}(\beta_{i,n-1}/\delta_i)\vec{p}_i$$

where $\delta_n=\|\vec{p}_n\|$

Then:

$$h_n=\vec{p}_n/\delta_n$$

$$\alpha_{ij} = \vec{h}_i^H \vec{h}_j$$

$$\omega_n = \delta_n / q_n$$

Figure 10:
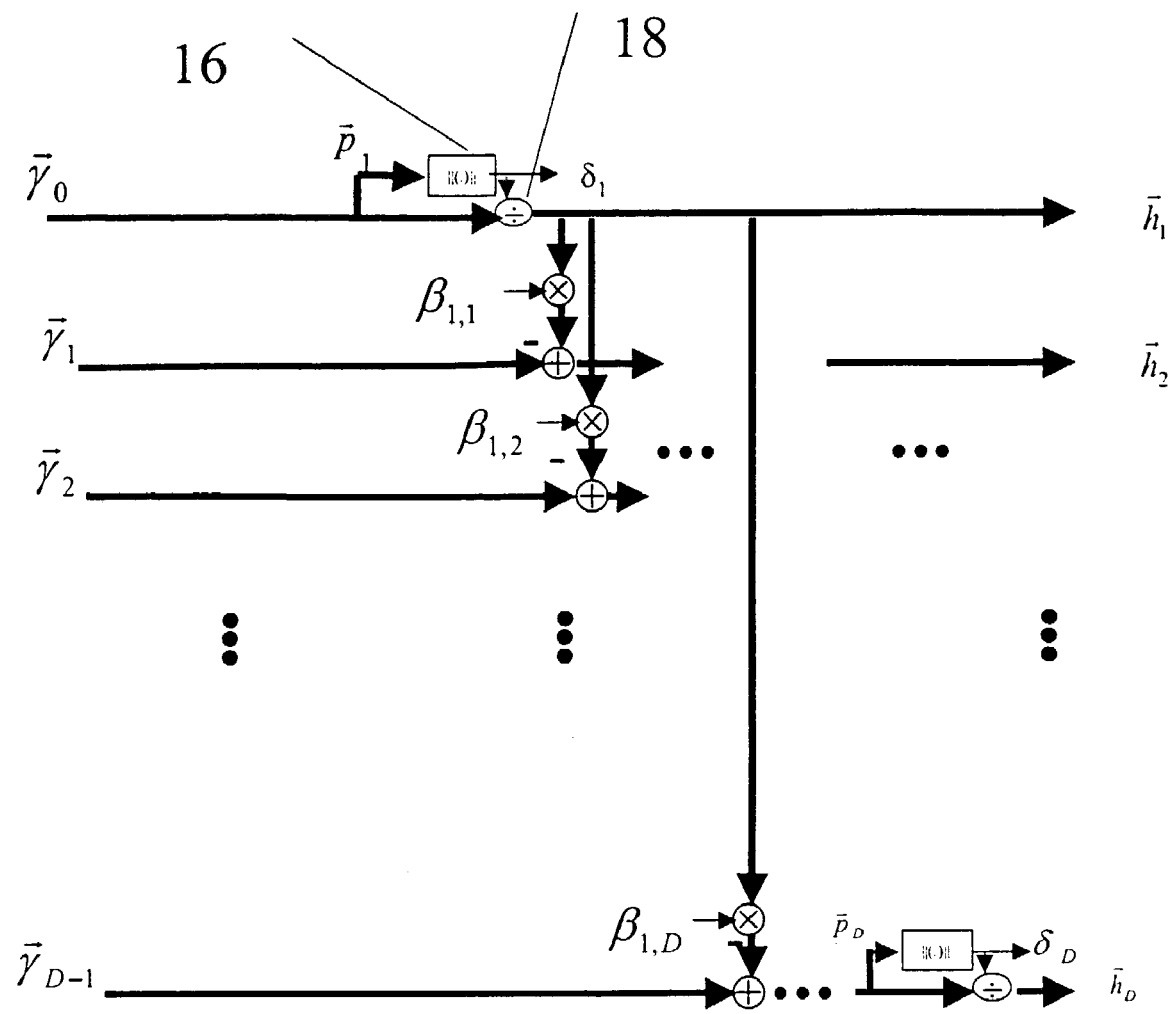
Figure 11:
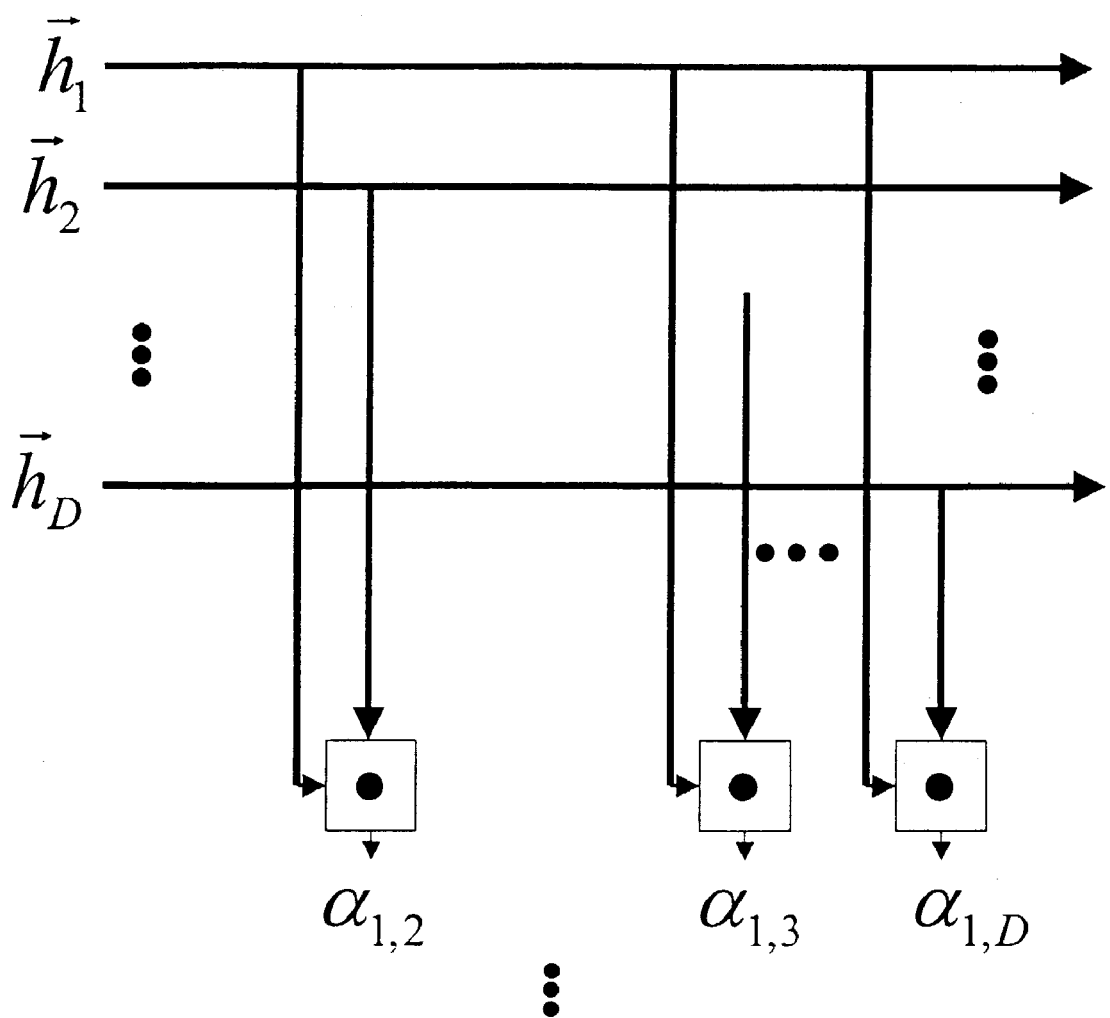
Figure 12:
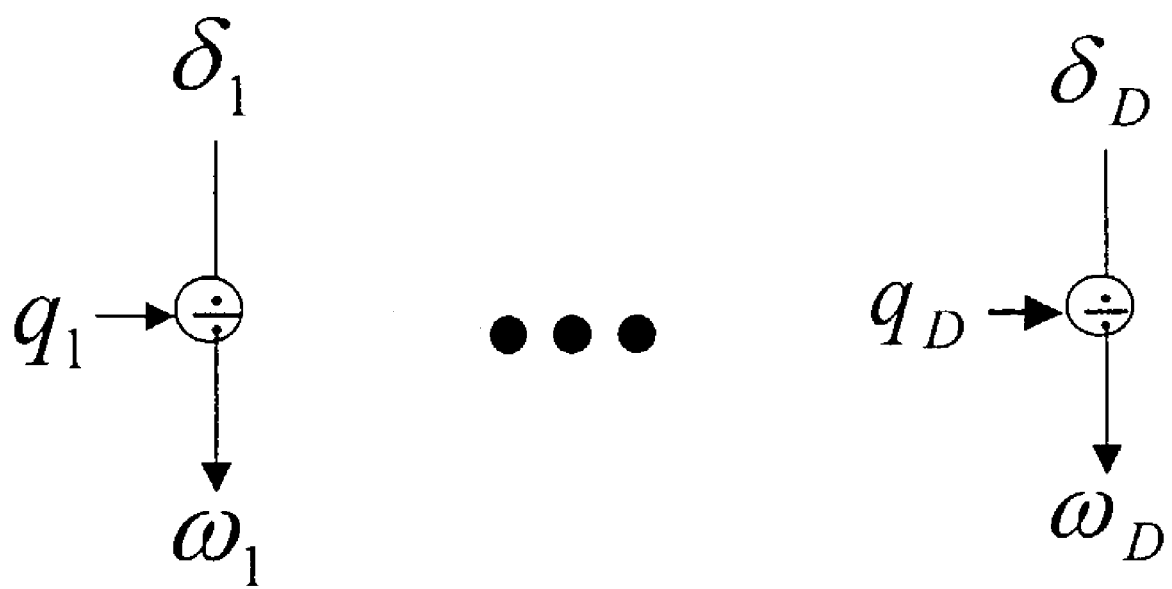

These are the calculations of the filter weights illustrated in FIGS. 10–12.

The assumptions underlying the simplifications discussed here are applicable in a variety of applications. In those applications, the simplified filter structure significantly reduces the cost of the adaptive multistage Wiener filter while still obtaining greater performance than conventional filtering schemes.

The adaptive multistage Wiener filter of FIGS. 2–12 is particularly well suited for the case where the data vector length N is small relative to the data block length M. From FIGS. 2–12 and/or the equations given for the first embodiment below, the computational complexity can be found as $4DNM+3D^2M+4DM+2NM+2D^2N+2DN+2D$. For the example discussed above this is $4.562*10^6$ arithmetic operations, a ~57% reduction in complexity over the complexity of the FIG. 1 filter.

Still further reductions in complexity can be achieved, with consequent reductions in expense. One such further simplification is illustrated in FIGS. 13–17. The circuitry of FIGS. 13–17 has general similarities to the circuitry of FIGS. 2–12 in that the illustrated adaptive multistage Wiener filter of FIGS. 13–17 includes a linear filter module 20 that operates at the sample (symbol) data rate and an update module 22 that preferably operates at a slower update rate that is preferably one of two rates used internally within the update module 22. In this illustration, the symbol rate clock is divided by circuitry 24 associated with the update module 22 to obtain the filter update rate. In many instances, the practical effect of this method of determining the filter coefficient update rate will be that the update clock rate will be a fraction of the update rate of only 0.1 to 0.001 of the symbol rate. As with the above discussion, it is possible that further computational simplification might be obtained by sharing some of the calculations between the linear filter module and the update module of the adaptive multistage Wiener filter of FIGS. 13–17.

Figure 13:
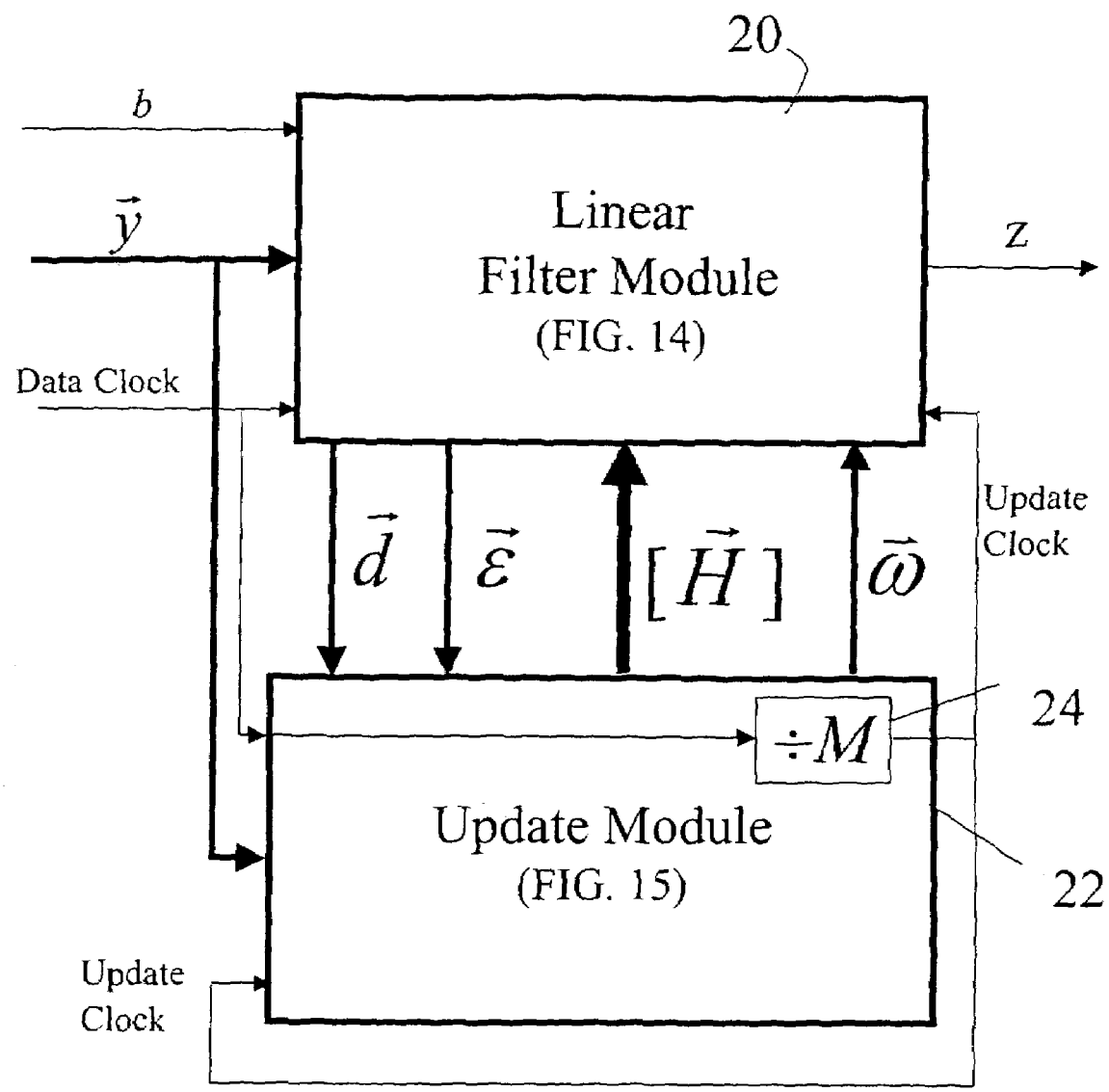
FIG. 13 illustrates another preferred implementation in accordance with the invention, also including a linear filter and an update module. The illustrated linear filter module receives input data vector y at the input data rate and produces scalar output z at the same rate. The linear filter module receives update coefficients from the illustrated update module at the update rate and provides output vector 6 and data vector d to the update module at the data rate. The second update module receives vectors y and d at the data rate and provides vectors α, ω and matrix H to the linear filter at the update rate.
Figure 14:
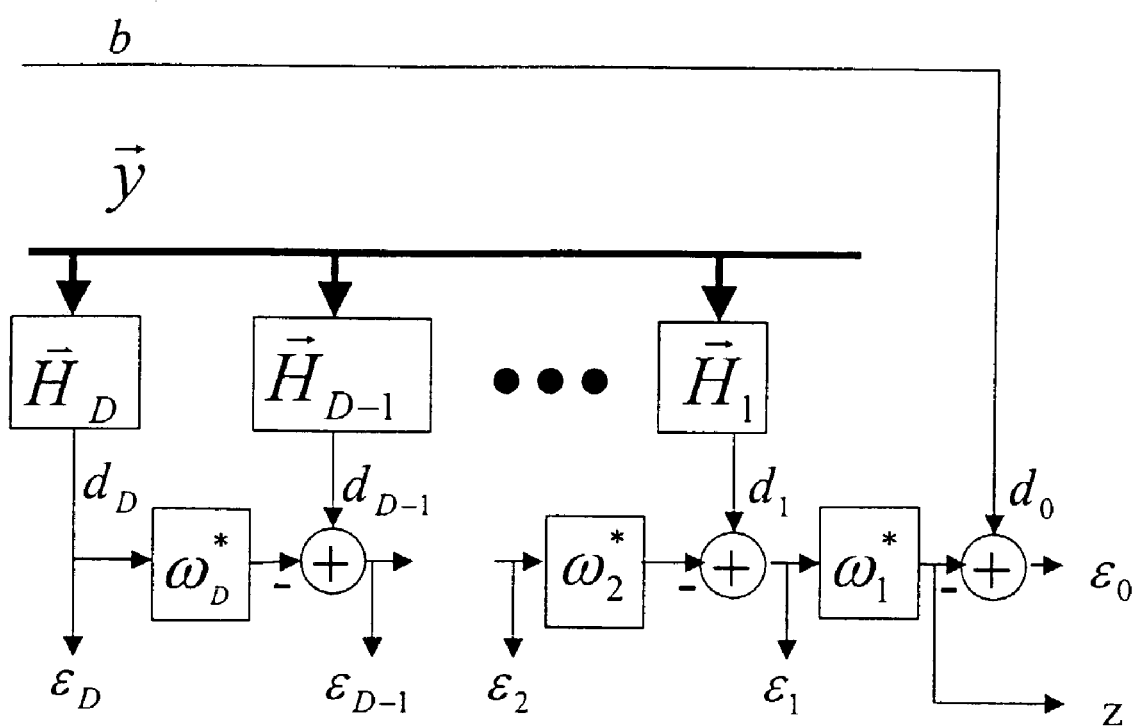
FIG. 14 illustrates a preferred linear filter module for use with the filter of FIG. 13. The linear filter receives as an input the input vector y and outputs the scalar quantity z. The module provides the vector d and the vector ε to the illustrated update module and the linear filter module receives the vectors α, ω and matrix H from the update module. It can be seen that the FIG. 14 linear filter module is considerably less complex as compared to the linear filter module of FIG. 3.
Figure 15:
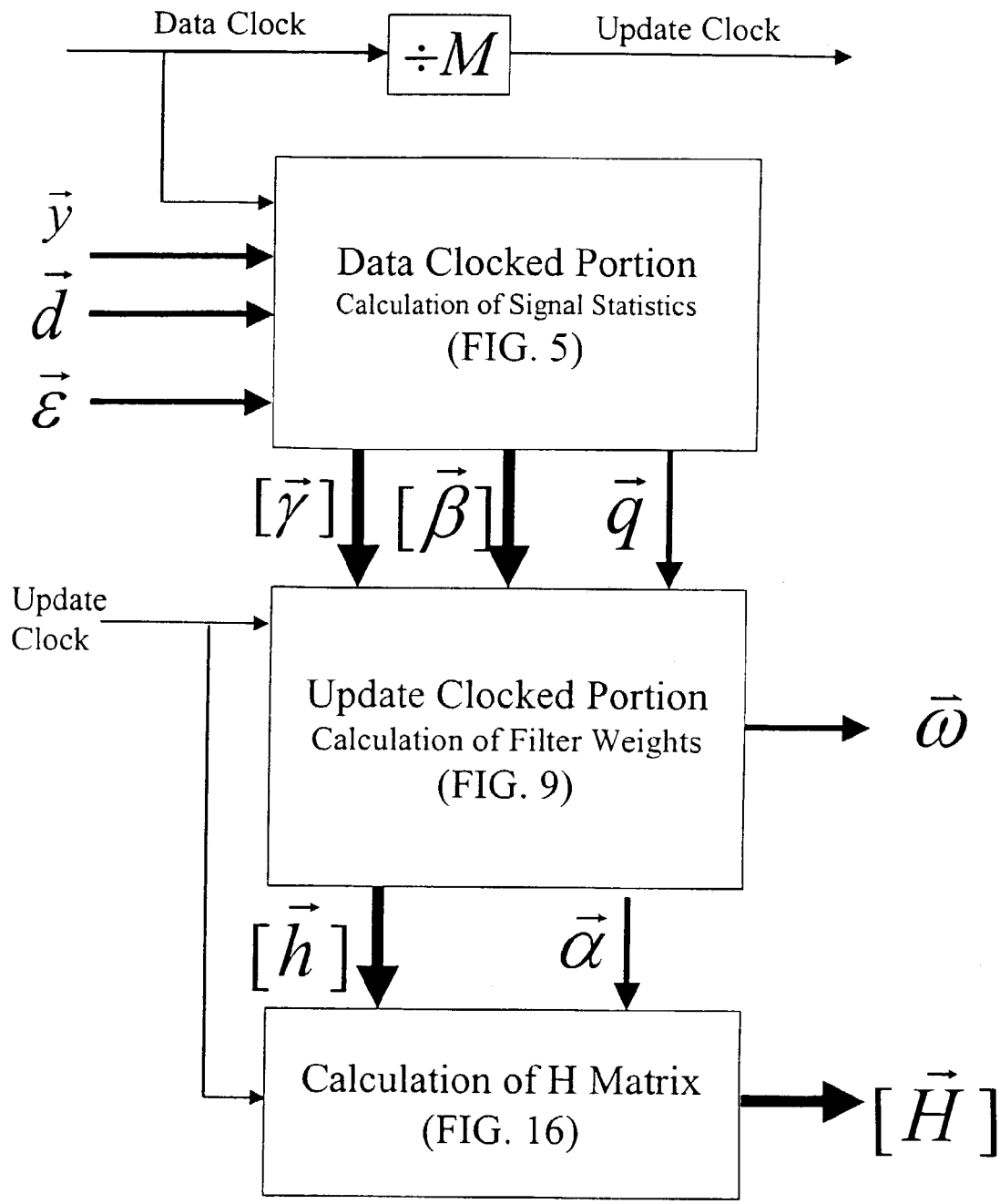
FIG. 15 shows the update module used in the filter of FIG. 13, which receives the vectors y, d and ε and outputs the matrix H and vectors α and ω. The FIG. 15 update module generates the update clock at the end of each data block. The data clocked sub-module (FIG. 5) operates at the data clock rate. The update clocked sub-module (FIG. 9) and the calculation of H matrix (FIG. 16) both operate at the update clock rate. The update module of FIG. 15 is similar to the update module of FIG. 4, except that the update module of FIG. 15 performs additional calculations to produce the matrix H from the matrix h.
Figure 16:
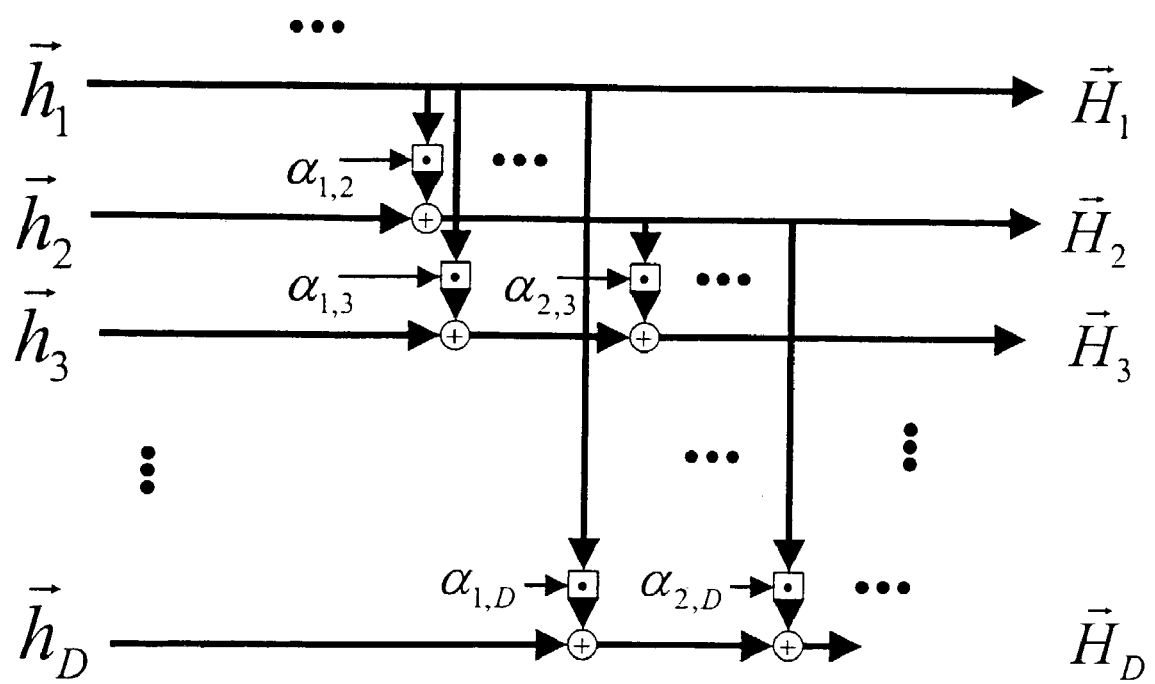
FIG. 16 shows the calculation of the H matrix. Matrices α and h are inputs and the circuit produces the matrix H as an output. The illustrated circuit operates at the update clock rate.

FIG. 13 illustrates the overall structure composed of the linear filter module and the update module. In comparison to the circuitry of FIG. 2, above, the FIG. 13 adaptive multistage Wiener filter eliminates a from the linear filter module 20 so that it is not passed between the linear filter module 20 and the update module 22. In the circuitry of FIGS. 13–17, a may still be calculated, but it is calculated wholly internally to the update module, as shown in FIGS. 15 and 16 below. $\alpha$ is combined with h in the circuitry of FIG. 16 to generate H, which functionally substitutes for h in the circuitry of FIGS. 13–17, in comparison to the circuitry of FIGS. 2–12.

The strategy embodied by the filter of FIGS. 13–17 is now illustrated, beginning with the discussion of the strategy underlying the multistage Wiener filter of FIGS. 2–12, above. In the previous linear filter module, $\vec{y}$ (m) is the input to the filter $\vec{\alpha}, \vec{h}$ are provided by the update module z(m) is the output of the filter.

$$d_n = \vec{y} \cdot \vec{h}_n - \sum_{i=1}^{n-1} \alpha_{i,n} d_i$$

$\epsilon_D = d_D$ $\epsilon_{n-1} = d_{n-1} - \omega_n^* \epsilon_n$ $z = \omega_1^* \epsilon_1$.

In simplifying this filter, substitute $d_i$ into the right hand side of the equation for $d_n$ and collect terms:

$$d_1 = \vec{y} \cdot \vec{h}_1 = \vec{y} \cdot \vec{H}_1$$

$$d_2 = \vec{y} \cdot \vec{h}_2 - \alpha_{1,2} \vec{y} \cdot \vec{h}_1 = \vec{y} \cdot (\vec{h}_2 - \alpha_{1,2} \vec{h}_1) = \vec{y} \cdot \vec{H}_2$$

etc.

Now define:

$$d_n = \vec{y} \cdot \vec{H}_n$$

where $$\vec{H}_n = \vec{h}_n - \sum_{i=1}^{n-1} \alpha_{i,n} \vec{h}_i.$$

The calculation of H is preferably placed in the update module and it is preferably calculated at the update rate. FIG. 14 illustrates the resulting linear filter module. This structure is much simpler than that illustrated in FIG. 3 and discussed above. It is also considerably less complex than the ResCor filter of the Honig, et al., paper.

Previous Filter Update Calculation

The filter update module shown in FIG. 3 preferably calculates and updates parameters at a much slower rate than the symbol rate. The filter update module of FIG. 3 calculates averages from the data that arrive at the symbol rate. The ensemble averages of the data that arrive at the symbol rate are approximated by time averages and these time averages are indicated here with angle brackets. For example <X> represents such a time average. <X> can be either incrementally updated or block updated:

Incremental Update $<X>_{new} = (1-\mu)<X>_{old} + \mu X$

Block Update $$<X> = \frac{1}{M} \sum_{m=1}^{M} X_m$$

Now from the equations above, $$\vec{p}_n = <\vec{y}_{n-1} d_{n-1}^*> \text{ and } \vec{y}_n = \vec{y}_{n-1} - \vec{h}_n d_n$$

$$\vec{y}_0 = \vec{y}$$

$$\vec{p}_1 = <\vec{y}_0 d_0^*>$$

$$\vec{p}_2 = <\vec{y}_1 d_1> = <(\vec{y}_0 - \vec{h}_1 d_1)d_1^*> = <\vec{y}_0 d_1^*> - \vec{h}_1 <|d_1|^2>$$

$$\vec{p}_n = <\vec{y} d_{n-1}^*> - \sum_{i=0}^{n-1} <d_i d_{n-1}^*> \vec{h}_i$$

Since the $\vec{h}$'s are updates from the $\vec{p}$'s as $\vec{h}_{new} \leftarrow \vec{p}/\delta$, a more accurate estate of $\vec{p}_n$ is:

$$\vec{p}_n = <\vec{y} d_{n-1}^*> - \sum_{i=1}^{n-1} <d_i d_{n-1}^*> \vec{p}_i/\delta_i \text{ where } \delta_i = \|\vec{p}_i\|$$

$$\vec{h}_n = \vec{p}_n/\delta_n \text{ where } \delta_n = \|\vec{p}_n\|$$

$$\beta_{ij} = <d_i d_j^*>; \quad \vec{p}_2 = <\vec{y} d_2^*> - \vec{h}_1 <|d_1|^2>; \quad \vec{\gamma}_i = <\vec{y} d_i^*>$$

Now $$\vec{p}_n = \vec{\gamma}_{n-1} - \sum_{i=1}^{n-1} \beta_{i,n-1} \vec{h}_i$$

Previous Update Module $$\vec{y}(m)$$

is an input to the module.

$$\vec{d}(m)$$

is an input to the module from the filter module.

At the input data rate calculate for n=0, 1, . . . D $$q_n = <\|\epsilon_n\|^2>$$

for all i, j=0,1, . . . D,calculate $$\beta_{ij} = d_i d_j^*>$$

$$\vec{\gamma}_i = <\vec{y} d_i^*>$$

At the update rate calculate for all n=0, 1, . . . D $$\vec{p}_n = \vec{\gamma}_{n-1} - \sum_{i=1}^{n-1} (\beta_{i,n-1}/\delta_i) \vec{p}_i$$

where $\delta_n = \|\vec{p}_n\|$
Then:

$$h_n = \vec{p}_n/\delta_n$$

$$\alpha_{ij} = \vec{h}_i^H \vec{h}_j$$

$$\omega_n = \delta_n/q_n$$

We now add the calculation of vector H (as defined above) into the new update module of FIGS. 15 and 16 as $$\vec{H}_n = \vec{h}_n - \sum_{i=0}^{n-1} \alpha_{i,n} \vec{h}_i$$

The vector H's are only calculated at the update rate, resulting in the more efficient update module of FIGS. 15–16. Note that the result is a more efficient implementation of the adaptive multistage Wiener filter than is illustrated in FIGS. 2–12. The calculations and the distribution of the circuitry are illustrated in FIGS. 13–16.

Figure 9:
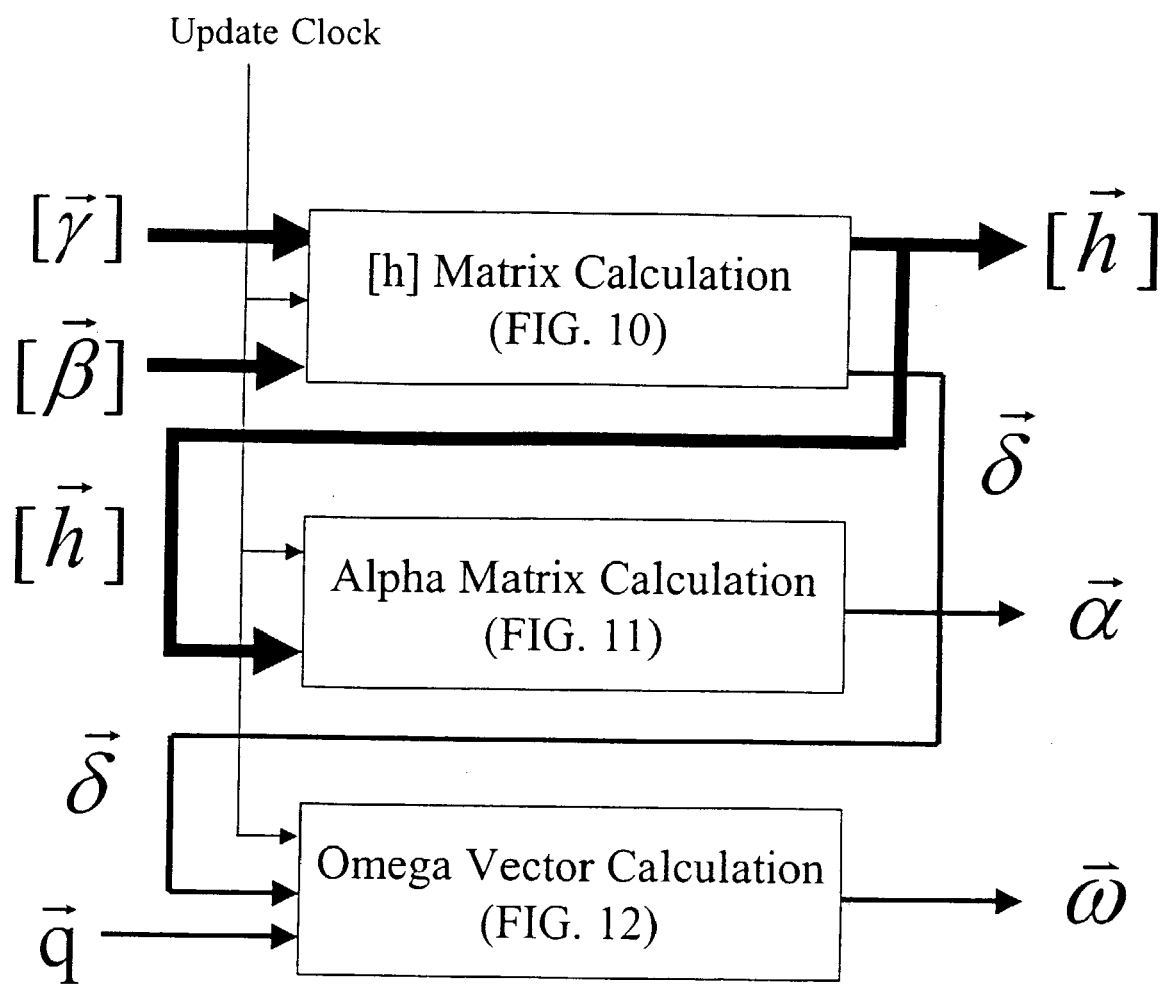
FIGS. 9–12 illustrate the calculations of the weight coefficients from the estimated signal parameters. These calculations occur at the update clock rate.

FIGS. 5 and 15 collect those portions of the update module 22 (from FIG. 13) that operate at the data clock rate at which the linear filter module 20 operates. FIGS. 9, 15 and 16 collect those portions of the update module 22 that operate at the update clock rate, which is considerably slower than the data clock rate. As discussed above and as is illustrated in FIG. 13, the update clock rate is preferably obtained by dividing the data clock rate so that the update clock rate might be on the order of 0.1 to 0.001 of the data (symbol) rate.

Figure 17A:
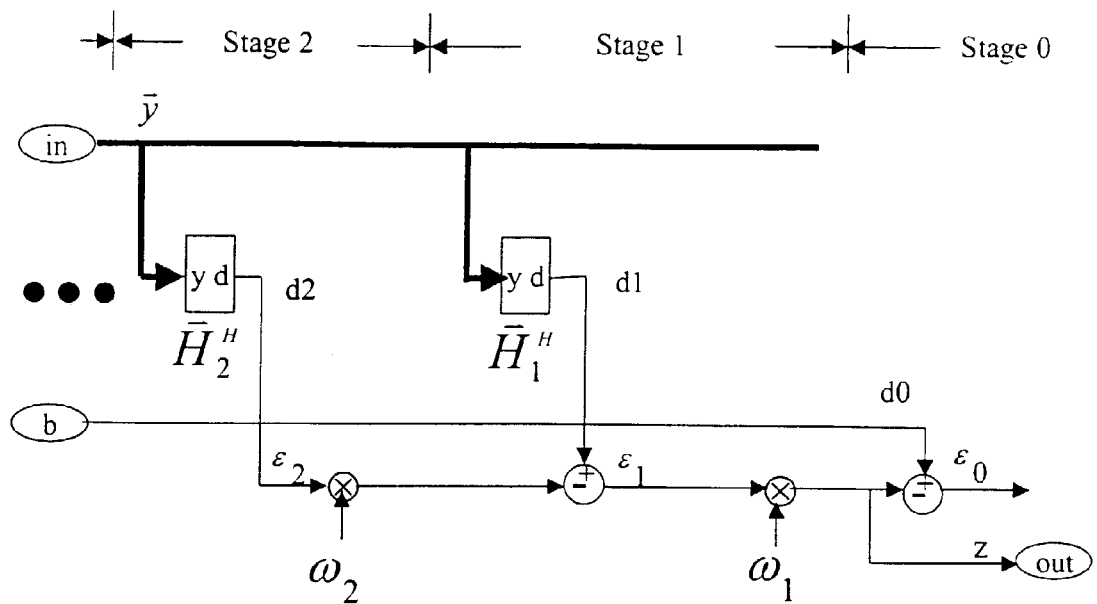
FIG. 17 illustrates a preferred implementation of an adaptive multistage Wiener filter according to the present invention, with FIG. 17(a) illustrating the linear filter portion of the Wiener filter and FIG. 17(b) showing the portion of the filter that updates and adjusts the parameters of the linear filter.
Figure 17B:
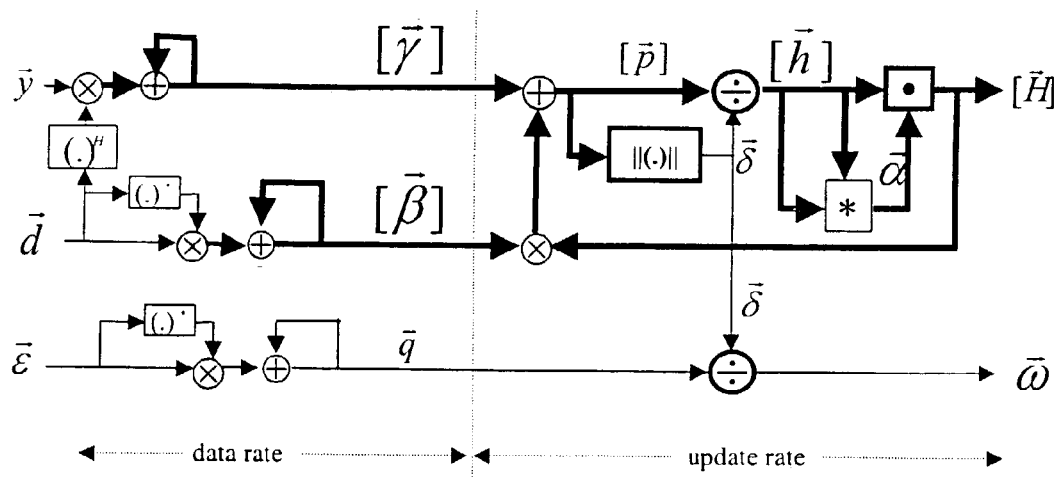

FIG. 17 provides another illustration of the filter of FIGS. 13–16, with FIG. 17(a) illustrating the linear filter portion of the Wiener filter and FIG. 17(b) showing the portion of the filter that updates and adjusts the parameters of the linear filter. As can be seen, the filter is constructed so that there is no backward recursive path and FIG. 17 allows a ready comparison of this implementation as compared to the conventional adaptive multistage Wiener filter of FIG. 1. Note the complexity reduction in the basic multistage filter that eliminates one vector-scalar multiplication and one vector—vector subtraction in each stage of the filter.

The linear filter module of the multistage Wiener filter is illustrated in FIG. 17(a) and includes a set of linear filter elements $H_2$ and $H_1$ along a forward path within the linear filter. As with the other multistage Wiener filters discussed here and shown in FIGS. 2–16, the number of stages within the FIG. 17(a) linear filter module is variable and is preferably selected according to the particular filtering application. Those of ordinary skill appreciate the procedures for selecting and optimizing the number of stages in a Wiener filter and those procedures are applicable here.

The two illustrated filtering stages of FIG. 17(a) receive the input data vectors in parallel and filter successive data vectors in parallel. The filter element $H_1$, for example, might be selected to be a matched filter that represents an a priori channel characterization. Filtering by the stage $H_1$ projects an input data vector along the steering vector represented by the matched filter. The filter stage $H_2$ (and any other additional $H_x$ stages that follow) represents interference, noise and distortion sources not represented by the matched filter. The filter elements are calculated so as to properly align with the interference sources without recursion. In the above discussion the $H_1$ filter element is assumed to be a matched filter. Alternately the illustrated stage $H_1$ could be an adaptive stage. In a still further alternate, the illustrated stage $H_1$ could be an adaptive stage and other adaptive filter stages could be used in conjunction with a matched or other filter that filters the signals prior to the signals being input to the linear filter of FIG. 17(a). All of these combinations are within the contemplated scope of the term adaptive multistage Wiener filter as that term is used here.

FIG. 17(b) shows the calculations used to adapt the filter coefficients H and the filter weights. The element indicated by ||(.)|| in FIG. 17(b) represents the calculation of a vector magnitude. As illustrated, portions of these calculations are performed at the symbol (data) rate and portions of the calculations are performed at the update rate.

Figure 1B:
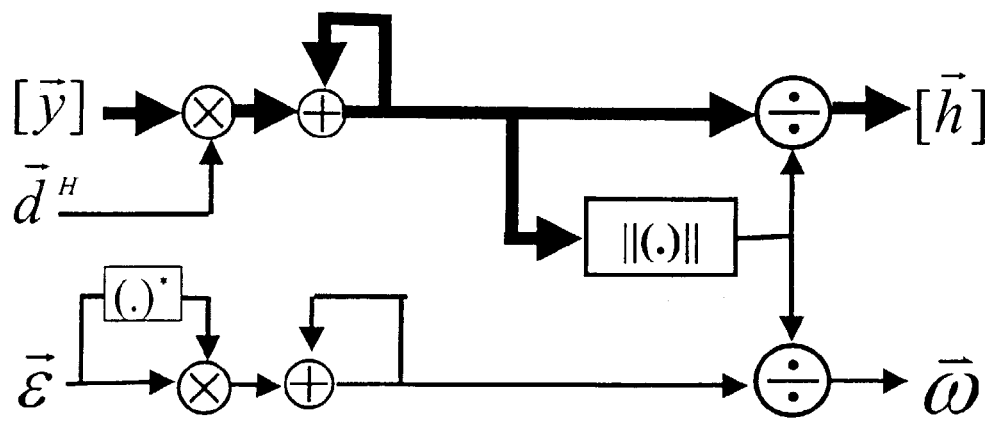

Comparing FIG. 1(a) and FIG. 17(a) it can be seen that the calculations are substantially simplified in FIG. 17(a) in that the projections of the d estimates and the vector subtractions of the projected values from the data vectors performed in FIG. 1(a) are not performed in FIG. 17(a). Similarly comparing FIG. 1(b) with FIG. 17(b) it can be seen that update module for the FIG. 17(b) structure is more complex than the FIG. 1(b) update module. The added complexity within the update module requires calculations performed only at the update rate.

The adaptive multistage Wiener filter of FIGS. 13–17 is particularly well suited for implementations where the number of stages N is small relative to the data block length M. From FIGS. 13–17 and the equations given for the second embodiment below, the computational complexity can be found as $4DNM+2D^2M+4DM+2NM+3D^2N+^2D+2D$. For the example discussed above this is $4.472*10^6$ arithmetic operations, a ~58% reduction in complexity over the complexity of the FIG. 1 filter.

In a still further simplified implementation of the invention, illustrated in FIGS. 18–21, the update module preferably saves a subset of data samples and calculates comparatively infrequent updates to the filter coefficients from the subset of data samples. The sampling used to collect the subset of data samples occurs at a very slow rate, so that the total calculations performed by the update module are greatly reduced. The sampled update strategy for updating the filter coefficients assumes a channel (the varying parameters that distort and corrupt the data) that varies very slowly in time. The filter coefficients calculated from the comparatively infrequent samples are employed for a comparatively long time before a new sample of data is used to again calculate update coefficients. This implementation of the multistage Wiener filter therefore preferably employs three data calculation rates: first, the data rate of the filter that provides the filtered data; second the update rate of the calculations of new filter coefficients; and third, the sample rate at which samples of data blocks are taken to provide for the update calculations.

This aspect of the present invention further reduces the calculations in the adaptation part of the Wiener filter by employing only a sample of the data. This is permissible when the data channel and interference is changing only very slowly so that reliable parameter estimates can be made with only a subset of the data in a block. It can be seen that the complexity of the third linear filter is very low if the sample set is small compared to the data block. From FIGS. 18–21 and/or the equations given for the third embodiment below, the computational complexity can be found as $4DNMx+2D^2Mx+4DMx+2NM+3D^2N+4DN+2D$. For the example discussed above and with the ratio of sample_set size to data block size x=0.1, this is $6.5802*10^5$ arithmetic operations, a ~93% reduction in complexity over the complexity of the FIG. 1 filter, discussed above.

The circuitry of FIGS. 18–21 has general similarities to the circuitry of FIGS. 2–17 and in fact includes considerable circuitry in common with the circuitry of FIGS. 2–17. The adaptive multistage Wiener filter illustrated in FIGS. 18–21 includes a linear filter module 30 that operates at the sample (symbol) data rate and an update module 32 that preferably operates at a plurality of rates including an update rate slower than the sample (symbol) data rate at which the linear filter module 30 operates. As with the above discussion, it is possible that further computational simplification might be obtained by sharing some of the calculations between the linear filter module and the update module of the adaptive multistage Wiener filter of FIGS. 18–21.

Figure 18:
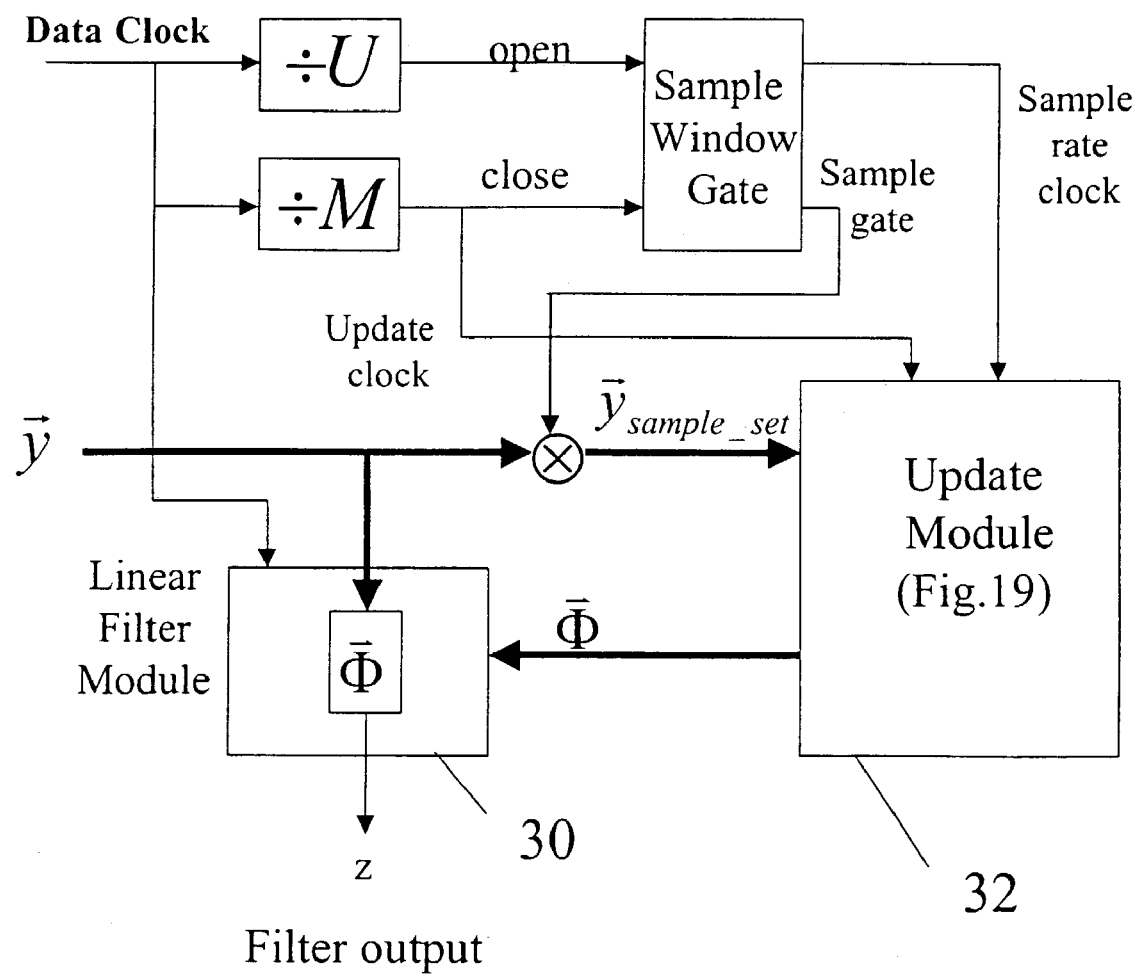
FIG. 18 illustrates another implementation of an adaptive multistage Wiener filter in accordance with the invention, also including a linear filter and an update module. The illustrated adaptive multistage Wiener filter also includes a control circuit to choose a sample of the data vector y and provide an appropriate sample data clock.

The FIG. 18 adaptive multistage Wiener filter also includes a control circuit to choose a sample of the data vector y and provide an appropriate sample data clock. The implementation illustrated in FIGS. 18–21 is most suited to the case where the required adaptation rate is very low, and thus M is very large, so that only a sample of the input data in the data block is needed to calculate reliable statistical estimates of the signal and channel parameters. The linear filter module receives input data vector y at the input data rate and produces output z at the same rate. The linear filter receives update coefficients from the update module at the update rate and provides vector output ε and data vector d to the update module at the data rate. The update module (FIG. 19) receives vectors y and d at the data rate and provides vector Φ at the update rate.

The update module 32 of FIG. 18 preferably internally calculates the vectors d and ε from the comparatively infrequent data sample instead of obtaining them from the filter module. This reduction in calculations can be achieved when the channel changes very slowly as compared to the data rate. Because of the change in the method of calculating updates, the FIG. 18 filter preferably uses a simplified linear filter module. The linear filter 30 is preferably selected to be the reduced complexity, single simple filter:

$$\vec{\Phi} = \vec{H}_0 - w_1(\vec{H}_1 - w_2(\vec{H}_3 \ldots - w_D\vec{H}_D)) \ldots)$$

(illustrated in FIG. 21) and then FIG. 18 filter performs the very simple linear filtering operation:

$$z = \vec{\Phi} \cdot \vec{y}$$

as illustrated in FIG. 18.

Figure 19:
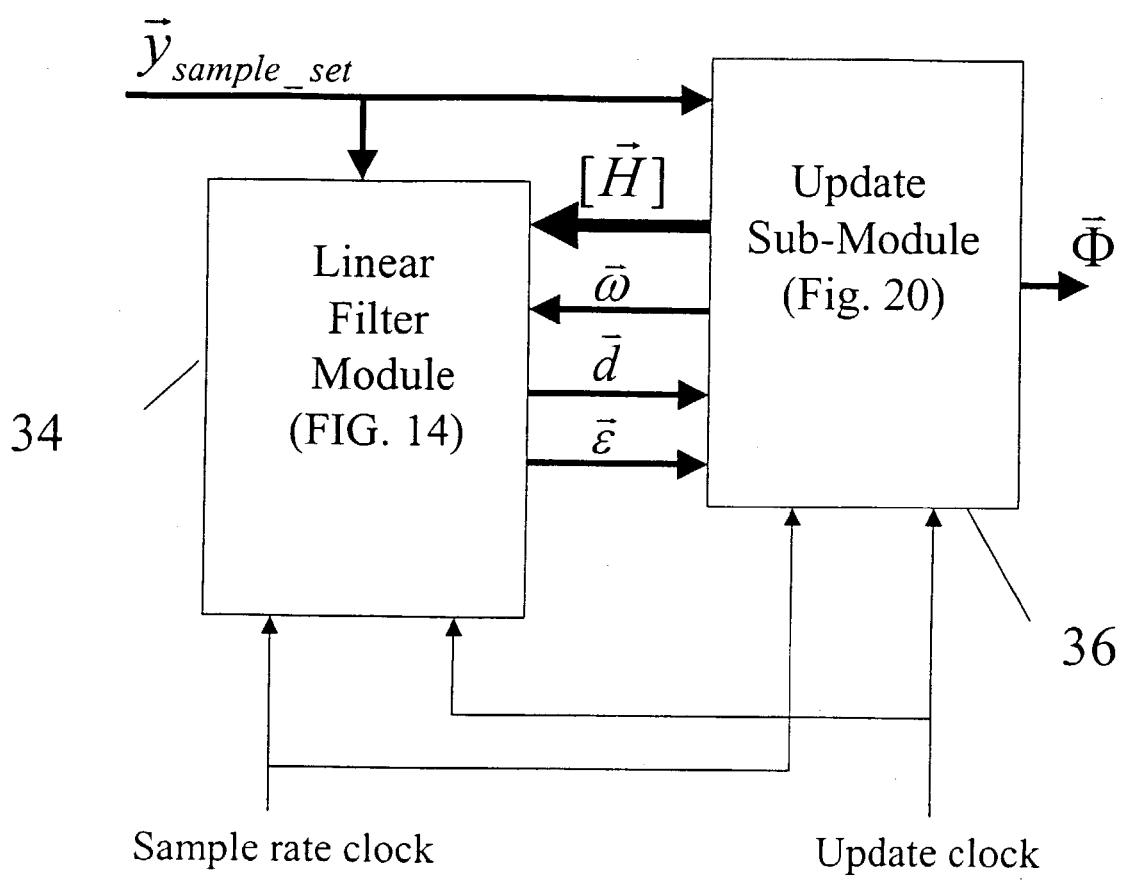
FIG. 19 illustrates an update module for use with the FIG. 18 Wiener filter that employs the linear filter module of FIG. 14 and the update sub-module of FIG. 20. In this illustrated implementation, the linear filter module (FIG. 14) operates only on a sample of the input data block and represents part of the added complexity to compensate for the very low complexity of the linear filter portion that is illustrated in FIG. 18 for use in that Wiener filter.
Figure 20:
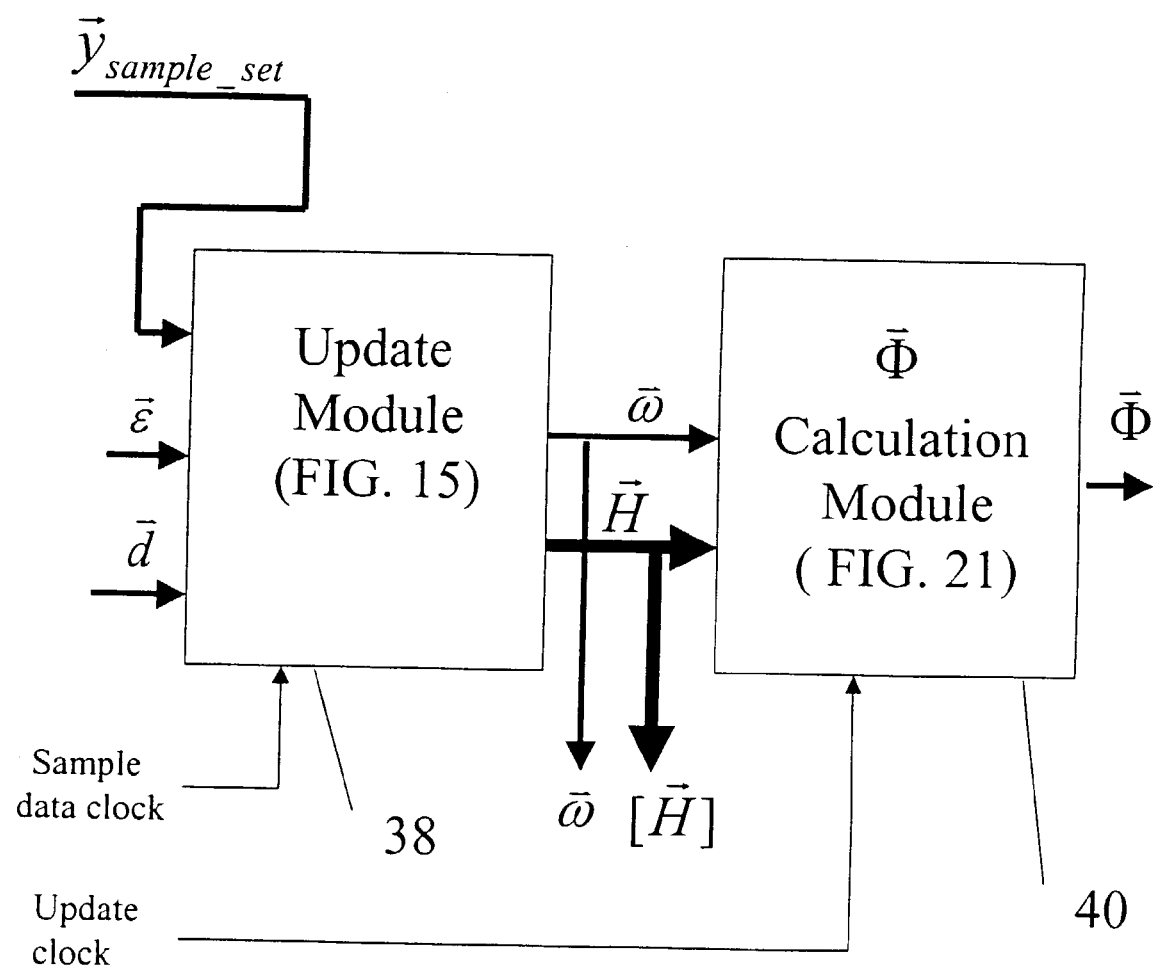
FIG. 20 illustrates a preferred update sub-module for use with the FIG. 19 update module that employs the update module of FIG. 15 and the Φ calculation of FIG. 21. Thus the Φ calculation represents another part of the added complexity necessary to compensate for the very low complexity of the FIG. 18 linear filter.
Figure 21:
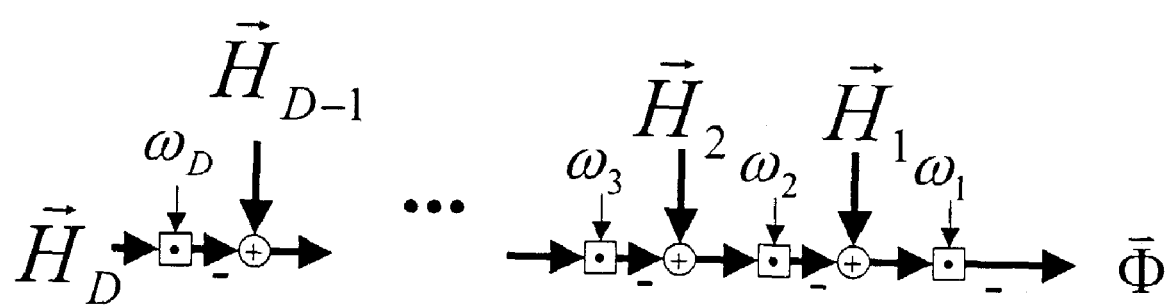
FIG. 21 illustrates the Φ calculation module for use in the FIG. 18 Wiener filter that accepts the matrix H and the vector ω and produces the vector Φ. The Φ calculation module operates at the update clock rate.

FIG. 19 illustrates the update module 32 shown in FIG. 18 and generally illustrates how the update module calculates the vectors d and E. The data sample is provided to an internal linear filter module 34 that calculates the vectors d and ε from the data sample vector $y_{sample\_set}$ and vectors H and ω from the update sub-module 36. The internal linear filter module 34 is triggered by the sample rate clock to calculate the vectors d and ε. In preferred implementations of the FIG. 18 circuitry, the internal linear filter module 34 has the same structure and operation as the circuit of FIG. 18, described above. Preferably, the update sub-module 36 has the structure illustrated in FIG. 20, which includes internal update module 38 and vector Φ calculation module 40. Preferably the internal update module 38 has the structure illustrated in FIGS. 15 and 20, described above, and the vector Φ calculation module 40 has the structure illustrated in FIG. 21.

Various circuits are described and illustrated in the discussion above. Many of these take the familiar forms of finite impulse response (FIR) or infinite impulse response (IIR) filters, although other implementations are possible. The described illustrated circuitry might be implemented in a variety of ways, including within a digital signal processor (DSP), within dedicated circuitry or within a combination of dedicated circuitry and general-purpose circuitry such as microprocessors or DSP cores.

The present invention has been described in terms of certain preferred embodiments thereof. Those of ordinary skill in the art will appreciate that various modifications might be made to the embodiments described here without varying from the basic teachings of the present invention. Consequently the present invention is not to be limited to the particularly described embodiments but instead is to be construed according to the claims, which follow.

I claim:

1. A multistage adaptive Wiener filter, comprising:
a linear filter module operating at a filter data rate and receiving symbols from a channel; and
an update filter module, coupled to receive signals from the linear filter module and provide updated filter coefficients to the linear filter module, the updated filter coefficients characteristic of the channel from which the symbols are received, the update filter module providing updated filter coefficients at a filter update rate so that the linear filter module functions as an adaptive multistage Wiener filter.

2. The Wiener filter of claim 1, wherein the filter data rate is more than ten times greater than the filter update rate.

3. The Wiener filter of claim 2, wherein the linear filter module receives symbols as input data at the filter data rate, the symbols divided into blocks with a first block preceding a second block, and wherein the linear filter module generates a first set of filter update coefficients from a first block and filters the symbols from a second block using the first set of filter update coefficients.

4. An adaptive multistage Wiener filter, comprising:
a linear filter module comprising first and second linear filter elements connected to receive an input data set in common at inputs to the first and second linear filter elements, the first and second linear filter elements performing distinct filtering operations on the input data set, the first linear filter element outputting first filtered data and the second linear filter element outputting second filtered data;
at least one weighting element and at least one combining element within the linear filter module, the second linear filter element providing the second filtered data to the at least one weighting element, the weighting element outputting weighted second filtered data, the combining element responsive to the weighted second filtered data and the first filtered data to output combined filtered data; and
an update module coupled to the linear filter module to provide updated filter coefficients to the first and second filter elements, the update module determining updated filter coefficients based at least in part on a correlation between the input data and filtered data so that the linear filter module functions as an adaptive Wiener filter.

5. The Wiener filter of claim 4, wherein the determining includes a cross correlation between the input data and filtered data that is normalized in magnitude.

6. The Wiener filter of claim 5, wherein the determining includes statistical processing based on an earlier obtained set of input data.

7. The Wiener filter of claim 6, wherein the update module provides updated filter coefficients at an update rate slower than the data rate at which input data are received by the linear filter module.

8. The Wiener filter of claim 7, wherein the update rate is less than ten times smaller than the data rate.

9. The Wiener filter of claim 4, wherein the update module determines the updated filter coefficients based on at least in part an autocorrelation of the filtered data.

10. The Wiener filter of claim 9, further comprising a third linear filter element receiving the input data set at its input, in common with the first and second linear filter elements, the third linear filter element outputting third filtered data, an output of the linear filter module responsive to the first, second and third filtered data.

11. The Wiener filter of claim 10, wherein the third linear filter is a matched filter.

12. The Wiener filter of claim 10, wherein the third linear filter is not adaptive.

13. The Wiener filter of claim 4, wherein the determining includes statistical processing based on an earlier obtained set of input data.

14. An adaptive multistage Wiener filter, comprising:
a linear filter module comprising first and second linear filter elements connected to receive an input data set at inputs to the first and second linear filter elements, the first and second linear filter elements receiving the same input data set and performing distinct filtering operations on the input data set, the first linear filter element outputting first filtered data and the second linear filter element outputting second filtered data;
at least one weighting element and at least one combining element within the linear filter module, the second linear filter element providing the second filtered data to the at least one weighting element, the weighting element outputting weighted second filtered data, the combining element responsive to the weighted second filtered data and the first filtered data to output combined filtered data; and
an update module coupled to the linear filter module to provide updated filter coefficients to the first filter element, the update module determining updated filter coefficients based at least in part on a correlation between the input data and filtered data so that the linear filter module functions as an adaptive Wiener filter.

15. The Wiener filter of claim 14, wherein the determining includes a cross correlation between the input data and filtered data that is normalized in magnitude.

16. The Wiener filter of claim 15, wherein the determining updated filter coefficients includes statistical processing based on an earlier obtained set of input data.

17. The Wiener filter of claim 16, wherein the statistical processing includes determining a cross correlation between input data and filtered data.

18. The Wiener filter of claim 16, wherein the statistical processing includes determining a cross correlation between an input data vector and a filtered data vector.

19. The Wiener filter of claim 16, wherein the statistical processing includes incrementally updating the cross correlation for successive samples of the input data.

20. The Wiener filter of claim 16, wherein the statistical processing includes calculating an average cross correlation from an earlier set of input data samples.

21. The Wiener filter of claim 14, the determining including an autocorrelation of the filtered data.

22. An adaptive multistage Wiener filter, comprising:
a linear filter module comprising first and second linear filter elements connected to respectively receive first and second input data, the first and second linear filter elements performing distinct filtering operations independent of the filtering operations of each other, the first linear filter element outputting first filtered data and the second linear filter element outputting second filtered data;

at least one weighting element, the second linear filter element providing the second filtered data to the at least one weighting element, the weighting element outputting weighted second filtered data, the combining element responsive to the weighted second filtered data and the first filtered data to output combined filtered data; and an update module coupled to the linear filter module to provide updated filter coefficients to the first filter element, the update module determining updated filter coefficients based in part on a correlation between the input data and filtered data so that the linear filter module functions as an adaptive Wiener filter.

23. The Wiener filter of claim 22, wherein the determining includes a cross correlation between the input data and filtered data that is normalized in magnitude.

24. The Wiener filter of claim 22, the determining including a cross correlation between the input data and filtered data and an autocorrelation of the filtered data.

25. The Wiener filter of claim 24, wherein the determining updated filter coefficients includes statistical processing based on an earlier obtained set of input data.

26. The Wiener filter of claim 25, wherein the statistical processing includes determining a cross correlation between input data and filtered data.

27. The Wiener filter of claim 25, wherein the statistical processing includes determining a cross correlation between an input data vector and a filtered data vector.

28. The Wiener filter of claim 25, wherein the statistical processing includes incrementally updating the cross correlation for successive samples of the input data.

29. The Wiener filter of claim 25, wherein the statistical processing includes calculating an average cross correlation from an earlier set of input data samples.

30. The Wiener filter of claim 25, wherein the first and second input data each consist of a common set of input data.

31. An adaptive multistage Wiener filter, comprising:
a first Wiener filter stage connected to receive input data, the first Wiener filter stage performing first filtering operations on the input data and outputting first filtered data, the first filtering operations characterized by a first filter coefficient;

a second Wiener filter stage connected to receive the input data in parallel with the first filter stage, the second Wiener filter stage performing second filtering operations on the input data and outputting second filtered data, the second filtering operations characterized by a second filter coefficient; and at least one weighting element and at least one combining element within the linear filter module, the second Wiener filter stage providing the second filtered data to the at least one weighting element, the weighting element outputting weighted second filtered data, the combining element responsive to the weighted second filtered data and the first filtered data to provide combined filtered data.

32. The Wiener filter of claim 31, further comprising a third Wiener filter stage receiving the input data at its input in parallel with the first and second Wiener filter stages, the third linear filter element outputting third filtered data, an output of the Wiener filter responsive to the first, second and third filtered data.

33. The Wiener filter of claim 32, wherein the third linear filter is a matched filter.

34. The Wiener filter of claim 31, wherein the second Wiener filter stage is coupled to the first Wiener filter stage and wherein the second Wiener filter stage is responsive to and conducts second filtering operations based on a value of the first filter coefficient.

35. The Wiener filter of claim 31, wherein the second Wiener filter stage has an update portion coupled to the first Wiener filter stage and wherein a value of the second filter coefficient is determined at least in part from an earlier value of the first filter coefficient.

36. The Wiener filter of claim 35, further comprising a third Wiener filter stage receiving the input data at its input in parallel with the first and second Wiener filter stages, the third Wiener filter stage performing a filtering operation characterized by a third filter characteristic determined at least in part from values of the first and second filter coefficients, an output of the Wiener filter responsive to the first, second and third filtered data.

37. An adaptive multistage Wiener filter, comprising:
a first Wiener filter stage performing first filtering operations and outputting first filtered data, the first filtering operations characterized by a first filter coefficient;

a second Wiener filter stage performing second filtering operations and outputting second filtered data, the second filtering operations characterized by a second filter coefficient, the second filter coefficient determined at least in part from a value of the first filter coefficient; and at least one weighting element and at least one combining element within the linear filter module, the second Wiener filter stage providing the second filtered data to the at least one weighting element, the weighting element outputting weighted second filtered data, the combining element responsive to the weighted second filtered data and the first filtered data to provide combined filtered data.

38. The Wiener filter of claim 37, further comprising a third Wiener filter stage receiving the input data at its input in parallel with the first and second Wiener filter stages, the third linear filter element outputting third filtered data, an output of the Wiener filter responsive to the first, second and third filtered data.

39. The Wiener filter of claim 38, wherein the third linear filter is a matched filter.

40. The Wiener filter of claim 37, wherein the second Wiener filter stage has an update portion coupled to the first Wiener filter stage and wherein a value of the second filter coefficient is determined at least in part from an earlier value of the first filter coefficient.

41. The Wiener filter of claim 40, further comprising a third Wiener filter stage receiving the input data at its input in parallel with the first and second Wiener filter stages, the third Wiener filter stage performing a filtering operation characterized by a third filter characteristic determined at least in part from values of the first and second filter coefficients, an output of the Wiener filter responsive to the first, second and third filtered data.

42. An adaptive multistage Wiener filter, comprising:
a first Wiener filter stage connected to receive input data, the first Wiener filter stage performing first filtering operations on the input data and outputting first filtered data, the first filtering operations characterized by a first filter coefficient;

a second Wiener filter stage connected to receive the input data in parallel with the first filter stage, the second Wiener filter stage performing second filtering operations on the input data and outputting second filtered data, the second filtering operations characterized by a second filter coefficient, the second filter coefficient determined at least in part from a value of the first filter coefficient; and at least one weighting element and at least one combining element within the linear filter module, the second Wiener filter stage providing the second filtered data to the at least one weighting element, the weighting element outputting weighted second filtered data, the combining element responsive to the weighted second filtered data and the first filtered data to provide combined filtered data.

43. The Wiener filter of claim 42, further comprising a third Wiener filter stage receiving the input data at its input in parallel with the first and second Wiener filter stages, the third linear filter element outputting third filtered data, an output of the Wiener filter responsive to the first, second and third filtered data.

44. The Wiener filter of claim 43, wherein the third linear filter is a matched filter.

45. The Wiener filter of claim 43, wherein the second Wiener filter stage has an update portion coupled to the first Wiener filter stage and wherein a value of the second filter coefficient is determined at least in part from an earlier value of the first filter coefficient.

46. The Wiener filter of claim 42, further comprising a third Wiener filter stage receiving the input data at its input in parallel with the first and second Wiener filter stages, the third Wiener filter stage performing a filtering operation characterized by a third filter characteristic determined at least in part from values of the first and second filter coefficients, an output of the Wiener filter responsive to the first, second and third filtered data.

47. An adaptive multistage Wiener filter, comprising:
a first filter stage characterized by a first stage filter vector, the first filter stage outputting a first stage estimate of a signal to be filtered by the adaptive multistage Wiener filter; and
a second filter stage characterized by a second stage filter vector, the second filter stage receiving as an input a sample vector including samples of the signal to be filtered by the adaptive multistage Wiener multistage, the second filter stage outputting a second stage estimate of the signal to be filtered,
wherein the second stage estimate is determined as a dot product between the sample vector and the second stage filter vector less the first stage estimate times a dot product between the first stage filter vector and the second stage filter vector.

48. The Wiener filter of claim 47, wherein the first filter stage is a matched filter.

49. The Wiener filter of claim 47, wherein the first filter stage receives as an input the sample vector.

50. The Wiener filter of claim 49, wherein the first stage estimate is determined as a dot product of the sample vector and the first stage filter vector.

51. The Wiener filter of claim 47, further comprising a third filter stage receiving the sample vector, the first stage estimate and the second stage estimate as an inputs to the third filter stage.

52. The Wiener filter of claim 51, further comprising at least one weighting element and at least one combining element responsive to the first stage estimate and the second stage estimate to provide combined filtered data.

53. An adaptive multistage Wiener filter, comprising:
a first filter stage characterized by a first stage filter vector, the first filter stage outputting a first stage estimate of a signal to be filtered by the adaptive multistage Wiener filter;
a second filter stage characterized by a second stage filter vector, the second filter stage outputting a second stage estimate of a signal to be filtered by the adaptive multistage Wiener filter; and
a third filter stage characterized by a third stage filter vector, the third filter stage receiving as an input a sample vector including samples of the signal to be filtered by the adaptive multistage Wiener multistage, the third filter stage outputting a third stage estimate of the signal to be filtered,
wherein the third stage estimate is determined as a dot product between the sample vector and the second stage filter vector less a sum of (1) the first stage estimate times a dot product between the first stage filter vector and the third stage filter vector and (2) the second stage estimate times a dot product between the second stage filter vector and the third stage filter vector.

* * * * *